(12) United States Patent
Mandai et al.

(10) Patent No.: US 11,476,372 B1
(45) Date of Patent: Oct. 18, 2022

(54) SPAD-BASED PHOTON DETECTORS WITH MULTI-PHASE SAMPLING TDCS

(71) Applicant: Apple Inc., Cupertino, CA (US)

(72) Inventors: Shingo Mandai, Mountain View, CA (US); Cristiano L. Niclass, San Jose, CA (US); Moshe Laifenfeld, Haifa (IL); Or Nahir, Tel Aviv (IL); Vyshakh Sanjeev, Singapore (SG)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/318,979

(22) Filed: May 12, 2021

Related U.S. Application Data

(60) Provisional application No. 63/023,976, filed on May 13, 2020.

(51) Int. Cl.
*H01L 31/02* (2006.01)
*H01L 27/146* (2006.01)
(Continued)

(52) U.S. Cl.
CPC .. *H01L 31/02027* (2013.01); *H01L 27/14643* (2013.01); *H01L 31/107* (2013.01);
(Continued)

(58) Field of Classification Search
CPC ......... H01L 31/02027; H01L 27/14643; H01L 31/107; H04N 5/36965; H04N 5/37455;
(Continued)

(56) References Cited

U.S. PATENT DOCUMENTS

| 7,453,131 B2 | 11/2008 | Marshall et al. |
| 7,589,316 B2 | 9/2009 | Dunki-Jacobs |

(Continued)

FOREIGN PATENT DOCUMENTS

| CN | 103299437 | 9/2013 |
| CN | 103779437 | 5/2014 |

(Continued)

OTHER PUBLICATIONS

Charbon, et al., SPAD-Based Sensors, *TOF Range-Imaging Cameras*, F. Remondino and D. Stoppa (eds.), 2013, Springer-Verlag Berlin Heidelberg, pp. 11-38.

(Continued)

*Primary Examiner* — Albert H Cutler
(74) *Attorney, Agent, or Firm* — Brownstein Hyatt Farber Schreck, LLP

(57) ABSTRACT

A method of building a moving average histogram of photon times of arrival includes, for each time interval in first and second subsets of time intervals, latching a time reference corresponding to a time of receipt of an avalanche timing output signal of a single-photon avalanche diode (SPAD), and advancing a count stored at a memory address corresponding to the latched time reference. The memory address corresponds to a range of time references. The method further includes reading and clearing a first set of counts after the first subset of time intervals; phase-shifting the sequence of time references with respect to a set of memory addresses after the first subset of time intervals; reading and clearing a second set of counts after the second subset of time intervals; and building the moving average histogram using at least the first and second sets of counts.

20 Claims, 17 Drawing Sheets

(51) Int. Cl.
*H01L 31/107* (2006.01)
*H04N 5/369* (2011.01)
*H04N 5/3745* (2011.01)
*H04N 5/378* (2011.01)

(52) U.S. Cl.
CPC ......... *H04N 5/36965* (2018.08); *H04N 5/378* (2013.01); *H04N 5/37455* (2013.01)

(58) Field of Classification Search
CPC .... H04N 5/378; H04N 5/3454; H04N 5/3456; H04N 5/3745
See application file for complete search history.

(56) References Cited

U.S. PATENT DOCUMENTS

| | | | |
|---|---|---|---|
| 7,667,400 B1 | 2/2010 | Goushcha | |
| 7,714,292 B2 | 5/2010 | Agarwal et al. | |
| 7,838,956 B2 | 11/2010 | McCarten et al. | |
| 8,355,117 B2 | 1/2013 | Niclass | |
| 8,637,875 B2 | 1/2014 | Finkelstein et al. | |
| 8,653,434 B2 | 2/2014 | Johnson et al. | |
| 8,724,096 B2 | 5/2014 | Gosch et al. | |
| 9,006,641 B2 | 4/2015 | Drader | |
| 9,058,081 B2 | 6/2015 | Baxter | |
| 9,151,829 B2 | 10/2015 | Campbell | |
| 9,160,949 B2 | 10/2015 | Zhang et al. | |
| 9,164,144 B2 | 10/2015 | Dolinsky | |
| 9,176,241 B2 | 11/2015 | Frach | |
| 9,178,100 B2 | 11/2015 | Webster et al. | |
| 9,209,320 B1 | 12/2015 | Webster | |
| 9,312,401 B2 | 4/2016 | Webster | |
| 9,313,434 B2 | 4/2016 | Dutton et al. | |
| 9,331,116 B2 | 5/2016 | Webster | |
| 9,354,332 B2 | 5/2016 | Zwaans | |
| 9,417,326 B2 | 8/2016 | Niclass et al. | |
| 9,448,110 B2 | 9/2016 | Wong | |
| 9,478,030 B1 | 10/2016 | Lecky | |
| 9,516,244 B2 | 12/2016 | Borowski | |
| 9,560,339 B2 | 1/2017 | Borowski | |
| 9,639,063 B2 | 5/2017 | Dutton et al. | |
| 9,661,308 B1 | 5/2017 | Wang et al. | |
| 9,685,576 B2 | 6/2017 | Webster | |
| 9,831,283 B2 | 11/2017 | Shepard et al. | |
| 9,915,733 B2 | 3/2018 | Fried et al. | |
| 9,935,231 B2 | 4/2018 | Roehrer | |
| 9,939,316 B2 | 4/2018 | Scott | |
| 9,952,323 B2 | 4/2018 | Deane | |
| 9,985,163 B2 | 5/2018 | Moore | |
| 10,026,772 B2 | 7/2018 | Shinohara | |
| 10,145,678 B2 | 12/2018 | Wang et al. | |
| 10,153,310 B2 | 12/2018 | Zhang et al. | |
| 10,217,889 B2 | 2/2019 | Dhulla et al. | |
| 10,261,175 B2 | 4/2019 | Halliday | |
| 10,267,901 B2 | 4/2019 | Drader | |
| 10,438,987 B2 | 10/2019 | Mandai et al. | |
| 10,451,736 B2 | 10/2019 | Stutz | |
| 10,495,736 B2 | 12/2019 | Zhuang et al. | |
| 10,613,225 B2 | 4/2020 | Kubota et al. | |
| 10,620,300 B2 | 4/2020 | Sharma et al. | |
| 10,651,332 B2 | 5/2020 | Moussy | |
| 10,656,251 B1 | 5/2020 | Mandai et al. | |
| 10,658,419 B2 | 5/2020 | Mandai et al. | |
| 10,801,886 B2 | 10/2020 | Mandai et al. | |
| 2010/0159632 A1 | 6/2010 | Rhodes et al. | |
| 2012/0162632 A1 | 6/2012 | Dutton | |
| 2014/0231630 A1 | 8/2014 | Rae et al. | |
| 2017/0052065 A1* | 2/2017 | Sharma | G01S 17/894 |
| 2018/0210084 A1 | 7/2018 | Zwolfer et al. | |
| 2019/0018119 A1 | 1/2019 | Laifenfeld et al. | |
| 2019/0056497 A1* | 2/2019 | Pacala | G01S 7/4865 |
| 2019/0230304 A1* | 7/2019 | Moore | H03L 7/099 |
| 2019/0250257 A1 | 8/2019 | Finkelstein et al. | |
| 2019/0353760 A1* | 11/2019 | Hasegawa | H01L 31/10 |
| 2020/0158836 A1* | 5/2020 | Henderson | G01S 7/4863 |
| 2020/0174120 A1* | 6/2020 | Steigemann | G01S 17/08 |
| 2021/0116572 A1* | 4/2021 | Kimura | G01S 17/894 |
| 2022/0120875 A1* | 4/2022 | Amagawa | H04N 5/378 |
| 2022/0174235 A1* | 6/2022 | Kelly | H04N 5/2354 |

FOREIGN PATENT DOCUMENTS

| | | |
|---|---|---|
| CN | 104103655 | 10/2014 |
| CN | 104779259 | 7/2015 |
| CN | 104810377 | 7/2015 |
| CN | 105185796 | 12/2015 |
| DE | 102010060527 | 4/2012 |
| EP | 2787531 | 10/2014 |
| JP | 2012038981 | 2/2012 |
| JP | 2012169530 | 9/2012 |
| JP | 2014081254 | 5/2014 |
| JP | 2014225647 | 12/2014 |
| JP | 2015041746 | 3/2015 |
| JP | 2016145776 | 8/2016 |
| WO | WO 12/011095 | 1/2012 |
| WO | WO 12/032353 | 3/2012 |
| WO | WO 17/112416 | 6/2017 |
| WO | WO2021/124762 | * 11/2020 |

OTHER PUBLICATIONS

Cox, "Getting histograms with varying bin widths," http://www.stata.com/support/faqs/graphics/histograms-with-varying-bin-widths/, Nov. 13, 2017, 5 pages.

Gallivanoni, et al., "Progress n Quenching Circuits for Single Photon Avalanche Diodes," IEEE Transactions on Nuclear Science, vol. 57, No. 6, Dec. 2010, pp. 3815-3826.

Jahromi et al., "A Single Chip Laser Radar Receiver with a 9x9 SPAD Detector Array and a 10-channel TDC," 2013 Proceedings of the ESSCIRC, IEEE, Sep. 14, 2015, pp. 364-367.

Leslar, et al., "Comprehensive Utilization of Temporal and Spatial Domain Outlier Detection Methods for Mobile Terrestrial LiDAR Data," *Remote Sensing*, 2011, vol. 3, pp. 1724-1742.

Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.

Niclass, et al., "Design and Characterization of a Cmos 3-D Image Sensor Based on Single Photon Avalanche Diodes," *IEEE Journal of Solid-State Circuits*, vol. 40, No. 9, Sep. 2005, pp. 1847-1854.

Shin, et al., "Photon-Efficient Computational 3D and Reflectivity Imaging with Single-Photon Detectors," IEEE International Conference on Image Processing, Paris, France, Oct. 2014, 11 pages.

Tisa, et al., "Variable-Load Quenching Circuit for single-photon avalanche diodes," Optics Express, vol. 16, No. 3, Feb. 4, 2008, pp. 2232-2244.

Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.

* cited by examiner

| HC DENSITY 1302 | NO. OF PHASES 1304 | NO PIXEL BINNING 1306 | 2X2 PIXEL BINNING 1308 | 3X3 PIXEL BINNING 1310 | 4X4 PIXEL BINNING 1312 | 5X5 PIXEL BINNING 1314 | MxM PIXEL BINNING 1316 |
|---|---|---|---|---|---|---|---|
| 1 HC/ PIXEL | 1 | 1 | 4 | 9 | 16 | 25 | $M^2$ |
| | 4 | 4 | 16 | 36 | 64 | 100 | $4 \times M^2$ |
| 2 HC/ PIXEL | 1 | 2 | 8 | 18 | 32 | 50 | $2 \times M^2$ |
| | 4 | 8 | 32 | 72 | 128 | 200 | $8 \times M^2$ |
| 3 HC/ PIXEL | 1 | 3 | 12 | 27 | 48 | 75 | $3 \times M^2$ |
| | 4 | 12 | 48 | 108 | 192 | 300 | $12 \times M^2$ |
| 4 HC/ PIXEL | 1 | 4 | 16 | 36 | 64 | 100 | $4 \times M^2$ |
| | 4 | 16 | 64 | 144 | 256 | 400 | $16 \times M^2$ |
| N HC/ PIXEL | 1 | N | 4xN | 9xN | 16xN | 25xN | $N \times M^2$ |
| | 4 | 4xN | 16xN | 36xN | 64xN | 100xN | $4 \times N \times M^2$ |

NO. OF HCs AVAILABLE TO EACH PIXEL

SPAD-BASED PHOTON DETECTORS WITH MULTI-PHASE SAMPLING TDCS

CROSS-REFERENCE TO RELATED APPLICATION

This application is a nonprovisional of, and claims the benefit under 35 U.S.C. § 119(e) of, U.S. Provisional Patent Application No. 63/023,976, filed May 13, 2020, the contents of which are incorporated herein by reference as if fully disclosed herein.

FIELD

The described embodiments generally relate to single-photon avalanche diode (SPAD)-based photon detectors, such as SPAD-based depth sensors or three-dimensional (3D) image sensors. More particularly, the described embodiments relate to time-to-digital converters (TDCs) and histogram generation for SPAD-based photon detectors.

BACKGROUND

Existing and emerging consumer applications have created an increasing demand for real-time depth sensors and 3D image sensors (the latter of which are commonly known as light detection and ranging (LIDAR) sensors). Such sensors and detectors may in some cases be implemented using SPAD-based photon detectors.

A common technique used to determine the distance to each point of a target (e.g., to one or more objects in a field of view (FoV)) involves the measurement of round-trip times-of-flight (ToFs) of emitted pulses of electromagnetic radiation (e.g., a pixel-by-pixel measurement of round-trip ToFs of one or more photons, in each of a number of pulses of electromagnetic radiation).

The precision of ToF measurements made by a SPAD-based photon detector can be compromised by a variety of factors. For example, the use of a TDC or histogram memory with too few memory locations, or the use of memory locations with too shallow depth, can provide too coarse of a resolution or too much uncertainty (e.g., a sampling rate below the Nyquist frequency) for a desired application. However, TDCs and histogram memories capable of finer resolution or more measurement certainty can be costly in terms of area requirements, power consumption, manufacturing cost, and so on.

SUMMARY

Embodiments of the systems, devices, methods, and apparatus described in the present disclosure are directed to SPAD-based photon detectors and, more particularly, TDCs and histogram generation for SPAD-based photon detectors.

In a first aspect, the present disclosure describes a SPAD-based photon detector. The SPAD-based photon detector may include a SPAD configured to generate an avalanche timing output signal in response to a photon arrival during each of a set of time intervals; a memory configured to store a set of counts corresponding to a set of photon time-of-arrival ranges; and a TDC. The TDC may be configured to receive, during each time interval in the set of time intervals, a sequence of time references having a relationship to a time interval; and the avalanche timing output signal. The TDC may also be configured to latch a time reference, in the sequence of time references, corresponding to a time of receipt of the avalanche timing output signal. The SPAD-based photon detector may also include a circuit configured to advance a count, in the set of counts, corresponding to the latched time reference. The sequence of time references may have a first phase for a first subset of time intervals in the set of time intervals. The sequence of time references may have a second phase, shifted from the first phase, for a second subset of time intervals in the set of time intervals. The first subset of time intervals may be distinct from the second subset of time intervals.

In another aspect, the present disclosure describes a method of building a moving average histogram of photon times of arrival. The method may include, for each time interval in a first subset of time intervals and a second subset of time intervals, latching a time reference corresponding to a time of receipt of an avalanche timing output signal of a SPAD, and advancing a histogram count stored at a memory address corresponding to the latched time reference. The time reference may be part of a sequence of time references for a time interval. The memory address may be part of a set of memory addresses storing a set of histogram counts. The memory address may correspond to a range of time references in the sequence of time references. The method may further include reading and clearing a first set of histogram counts from the set of memory addresses after the first subset of time intervals and before the second subset of time intervals; phase-shifting the sequence of time references with respect to the set of memory addresses after the first subset of time intervals and for the second subset of time intervals; reading and clearing a second set of histogram counts from the set of memory addresses after the second subset of time intervals; and building the moving average histogram using at least the first set of histogram counts and the second set of histogram counts.

In yet another aspect, the present disclosure describes an electronic device. The electronic device may include a SPAD configured to generate an avalanche timing output signal, in response to a photon arrival, during each of a set of time intervals; a TDC configured to capture, during each time interval in the set of time intervals, a timing of the avalanche timing output signal; a memory configured to store a set of counts in a set of memory locations, the set of memory locations corresponding to a programmable set of photon time-of-arrival ranges; and a circuit configured to increment a count in the set of counts, at a memory location, in the set of memory locations, corresponding to a captured timing of the avalanche timing output signal. A first number of timings of the avalanche timing output signal may be mapped to a second number of counts in the set of counts. The second number may be smaller than the first number. After a first subset of time intervals in the set of time intervals, and for a second subset of time intervals in the set of time intervals, the set of photon time-of-arrival ranges may be phase-shifted with respect to the set of memory locations.

In addition to the aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which:

FIG. 13 is a table that shows how multi-phase sampling of histogram counts (e.g., in accordance with techniques such as those described with reference to FIGS. 7-10) can be combined with pixel binning (i.e., the sharing of histogram counts by a set of pixels, as described with reference to FIGS. 4 and 11-12B) to increase the number of histogram counts available per pixel in an array of pixels, thus enabling an increase in histogram resolution;

Figure 1A:
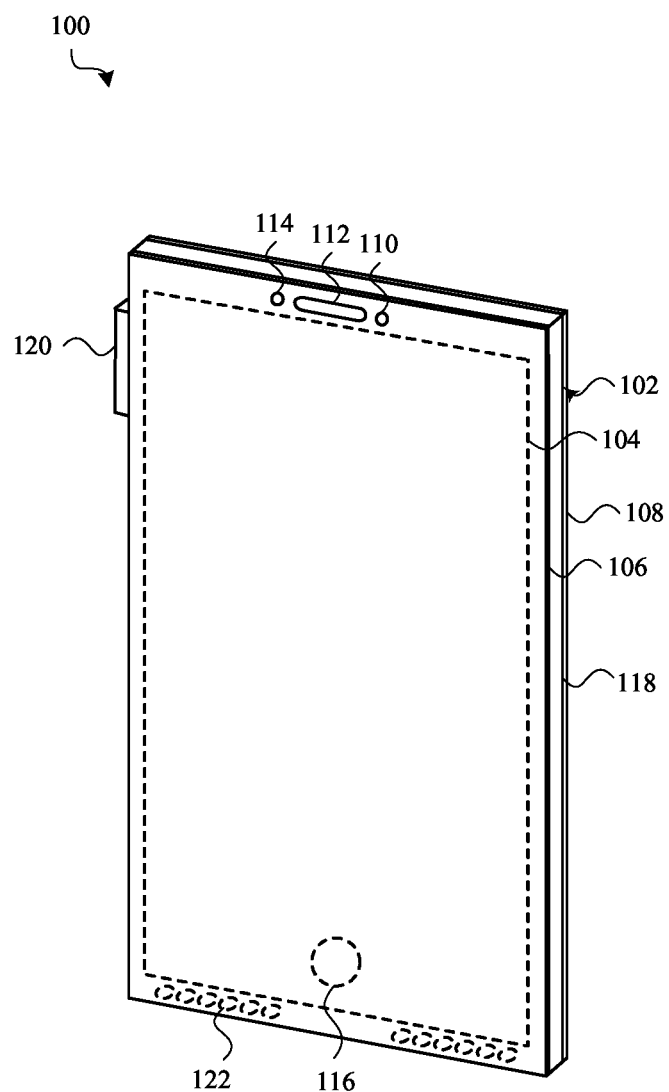
FIGS. 1A and 1B show an example of a device that may include an image sensor or depth sensor.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments and appended claims.

Some examples of challenges faced by SPAD-based photon detectors that are used to measure times-of-arrival (ToAs) or ToFs across multiple time intervals, such that a histogram of ToAs or ToFs can be generated, are: 1) an increase in ToA/ToF resolution typically requires an increase in memory size, because more memory locations are needed to maintain more ToA/ToF counts; 2) larger memories can be costly in terms of area requirements, static and dynamic power consumption (e.g., due to the increased capacitance along longer signal routes, and the need for a larger memory addressing and updating circuit), manufacturing cost, and so on; and 3) larger histogram memories typically have to be implemented on-chip (e.g., on the same chip as an array of SPADs) because of insufficient bandwidth to read out the output of all of the pixels in an array after each detection cycle.

Disclosed herein are systems, devices, methods, and apparatus that enable the generation of a histogram having finer resolution, but with a smaller memory than would conventionally be used. For example, in accordance with some embodiments, a set of time intervals for which a histogram is built is divided into multiple subsets of time intervals. For each subset of time intervals, there is a many-to-one mapping of time references to memory locations (or counts). However, the many-to-one mappings for different subsets of time intervals are phase-shifted with respect to the many-to-one mappings for other subsets of time intervals. Thus, when a SPAD detects the arrival of one or more photons and generates an avalanche timing output signal, and a TDC captures a current time reference in a sequence of time references, the TDC may cause one or another count to be updated, depending on the "phase" associated with the subset of time intervals in which the avalanche timing output signal is generated.

These and other embodiments are described with reference to FIGS. 1A-15. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

Figure 1B:
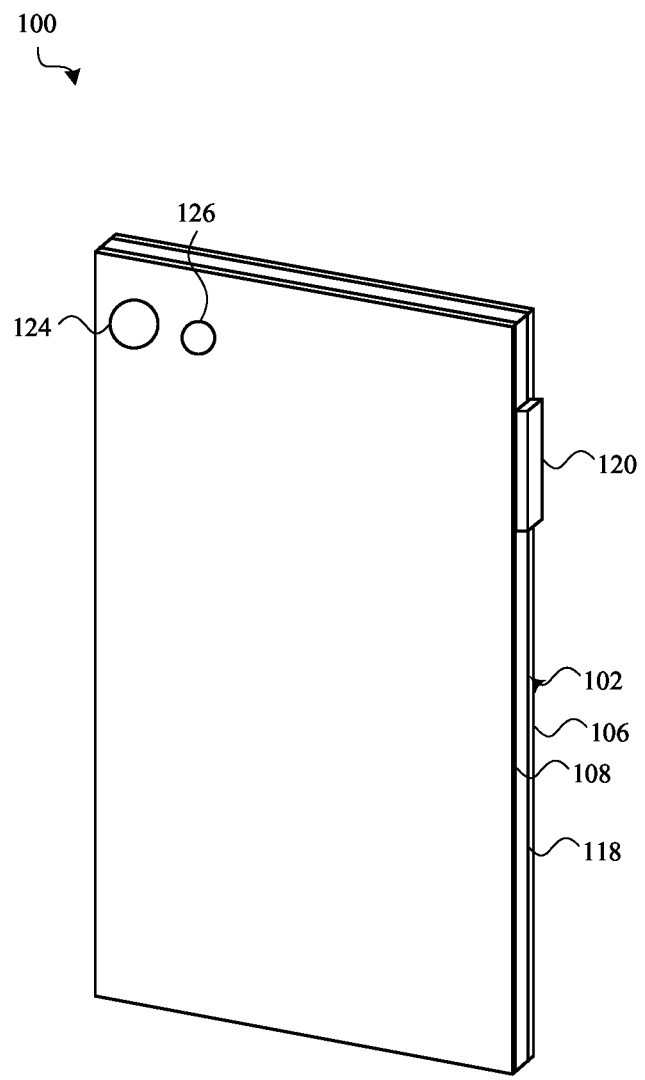

FIGS. 1A and 1B show an example of a device 100 that may include an image sensor or depth sensor. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable music player, wearable device (e.g., an electronic watch, health monitoring device, or fitness tracking device), augmented reality (AR) device, virtual reality (VR) device, mixed reality (MR) device, gaming device, portable terminal, digital single-lens reflex (DSLR) camera, video camera, vehicle navigation system, robot navigation system, or other portable or mobile device. The device 100 could also be a device that is semi-permanently located (or installed) at a single location. FIG. 1A shows a front isometric view of the device 100, and FIG. 1B shows a rear isometric view of the device 100. The device 100 may include a housing 102 that at least partially surrounds a display 104. The housing 102 may include or support a front cover 106 or a rear cover 108. The front cover 106 may be positioned over the display 104, and may provide a window through which the display 104 may be viewed. In some embodiments, the display 104 may be attached to (or abut) the housing 102 and/or the front cover 106. In alternative embodiments of the device 100, the display 104 may not be included and/or the housing 102 may have an alternative configuration.

The display 104 may include one or more light-emitting elements, and in some cases may be a light-emitting diode (LED) display, an organic LED (OLED) display, a liquid crystal display (LCD), an electroluminescent (EL) display, or another type of display. In some embodiments, the display 104 may include, or be associated with, one or more touch and/or force sensors that are configured to detect a touch and/or a force applied to a surface of the front cover 106.

The various components of the housing 102 may be formed from the same or different materials. For example, a sidewall 118 of the housing 102 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are conductive or non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

In some cases, a force sensor (or part of a force sensor system) may be positioned within the interior volume above, below, and/or to the side of the display 104 (and in some cases within the device stack). The force sensor (or force sensor system) may be triggered in response to the touch sensor detecting one or more touches on the front cover 106 (or a location or locations of one or more touches on the front cover 106), and may determine an amount of force associated with each touch, or an amount of force associated with a collection of touches as a whole. In some embodiments, the force sensor (or force sensor system) may be used to determine a location of a touch, or a location of a touch in combination with an amount of force of the touch. In these latter embodiments, the device 100 may not include a separate touch sensor.

As shown primarily in FIG. 1A, the device 100 may include various other components. For example, the front of the device 100 may include one or more front-facing cameras 110 (including one or more 3D image sensors or depth sensors), speakers 112, microphones, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. In some embodiments, a flash or electromagnetic radiation source (e.g., a visible or IR light source) may be positioned near the front-facing camera. In some cases, the front-facing camera 110 may be positioned behind the display 104 and receive electromagnetic radiation (e.g., light) through the display 104. In some cases, a depth sensor may be used to determine a distance to a user or generate a depth map of the user's face, or determine a distance or proximity to an object or generate a depth map of the object or a FoV that includes the object. The device 100 may also include various input devices, including a mechanical or virtual button 116, which may be accessible from the front surface (or display surface) of the device 100.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122.

For example, an ambient pressure sensor, ambient temperature sensor, internal/external differential pressure sensor, gas sensor, particulate matter concentration sensor, or air quality sensor may be positioned in or near a port 122.

In some embodiments, the rear surface of the device 100 may include a rear-facing camera 124 that includes one or more 3D image sensors or depth sensors (see FIG. 1B). A flash or electromagnetic radiation source 126 (e.g., a visible or IR light source) may also be positioned on the rear of the device 100 (e.g., near the rear-facing camera). In some cases, the rear surface of the device 100 may include multiple rear-facing cameras.

Figure 2:
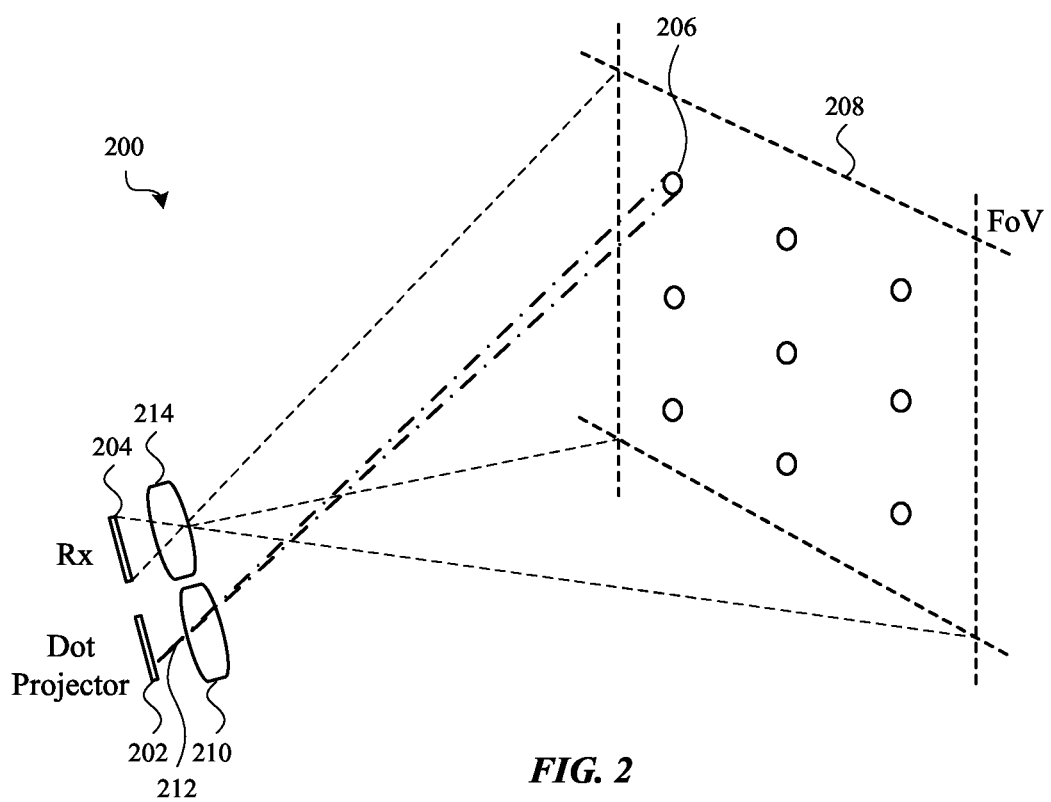
FIG. 2 shows an example of a SPAD-based photon detector.

FIG. 2 shows an example of a SPAD-based photon detector 200, such as a 3D image sensor or depth sensor. In some cases, the SPAD-based photon detector 200 may be a 3D image sensor or depth sensor of the device described with reference to FIGS. 1A-1B.

By way of example, the SPAD-based photon detector 200 uses a dot projector. In accordance with a dot projection system, the SPAD-based photon detector 200 includes a dot projector 202 and a detector/receiver (Rx) 204. The dot projector 202 may include any suitable electromagnetic radiation source that is capable of projecting one or more dots of illumination 206 into a FoV 208, such as a vertical-cavity surface-emitting laser (VCSEL), a vertical external-cavity surface-emitting laser (VECSEL), a quantum-dot laser (QDL), a quantum cascade laser (QCL), a light-emitting diode (LED) (e.g., an organic LED (OLED), a resonant-cavity LED (RC-LED), a micro LED (mLED), a superluminescent LED (SLED), or an edge-emitting LED), any other form of laser, and so on. In some embodiments, the dot projector 202 may include multiple electromagnetic radiation sources, operated independently or together. In some embodiments, the dot projector 202 may be operated to emit a pulse of electromagnetic radiation in each of a set of time intervals. In some embodiments, the pulses may be emitted at a regular interval, referred to herein as a pulse repetition interval (PRI). The detector 204 may include an array of pixels, each including a SPAD.

In some embodiments, one or more lenses 210 may be positioned in the optical path of the dot projector 202 to direct electromagnetic radiation 212 emitted by the dot projector 202 toward the FoV 208. The lenses 210 may be configured to control the propagation angle and path of the electromagnetic radiation 212, so that only a portion (e.g., a dot 206 or subset of dots) of the FoV 208 is illuminated at any given time. Electromagnetic radiation reflected from a target or object in the FoV 208 may be received, through one or more lenses 214, that direct reflected electromagnetic radiation, from an emitted pulse of electromagnetic radiation, toward the detector 204.

Figure 3:
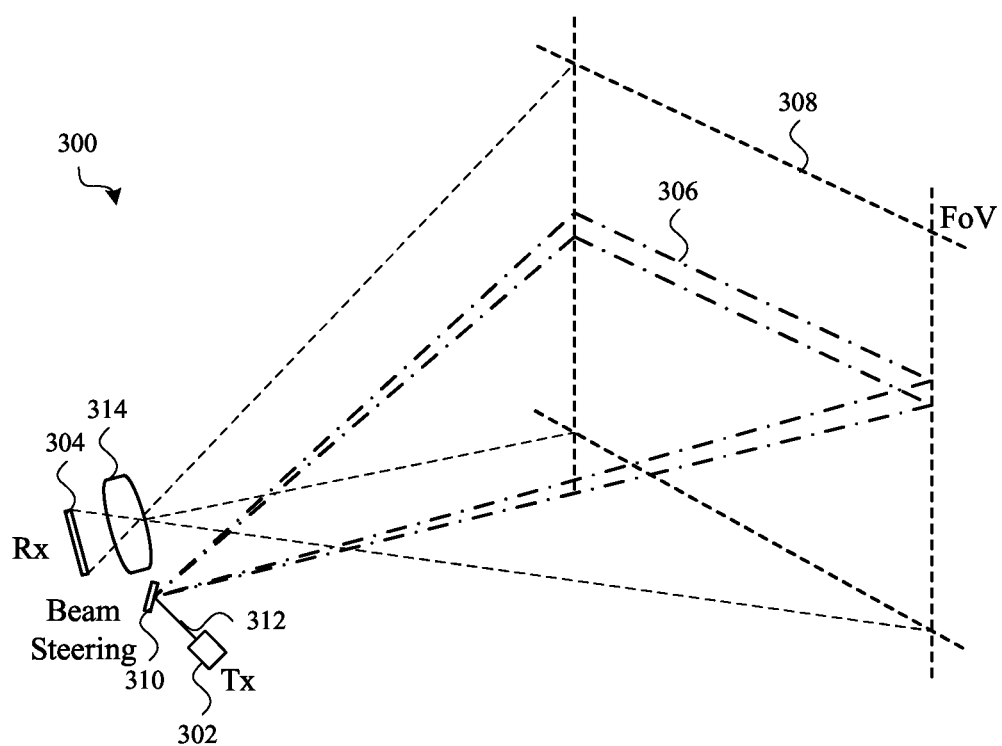
FIG. 3 shows another example of a SPAD-based photon detector.

FIG. 3 shows another example of a SPAD-based photon detector 300, such as a 3D image sensor or depth sensor. In some cases, the SPAD-based photon detector 300 may be a 3D image sensor or depth sensor of the device described with reference to FIGS. 1A-1B.

By way of example, the SPAD-based photon detector 300 uses a line-scan system. In accordance with a line-scan system, the SPAD-based photon detector 300 includes an emitter/transmitter (Tx) 302 and a detector/receiver (Rx) 304. The emitter 302 may be any suitable electromagnetic radiation source that is capable of projecting a line of illumination 306 into a FoV 308, such as a VCSEL, a VECSEL, a QDL, a QCL, or an LED (e.g., an OLED, an RC-LED, an mLED, a SLED, or an edge-emitting LED), any other form of laser, and so on. In some embodiments, the emitter 302 may be operated to emit a pulse of electromagnetic radiation in each of a set of time intervals. In some embodiments, the pulses may be emitted at a PRI. The detector 304 may include an array of pixels, each including a SPAD.

In some embodiments, a beam-steering element 310 (e.g., a mirror) may be positioned in the optical path of the emitter 302 to steer a pulsed beam of electromagnetic radiation 312 emitted by the emitter 302 toward the FoV 308. The beam-steering element 310 may be configured to control the propagation angle and path of the beam 312, so that only a portion (e.g., a line 306 or subset of lines) of the FoV 308 is illuminated at any given time. The FoV 308 may then be scanned, section-by-section or line-by-line, during a scanning period. The scanning period is a period of time needed to scan a selected portion, or all, of the FoV 308. Electromagnetic radiation reflected from a target or object in the FoV 308 may be received, through one or more lenses 314, that direct reflected electromagnetic radiation, from an emitted pulse of electromagnetic radiation, toward the detector 304.

Figure 4:
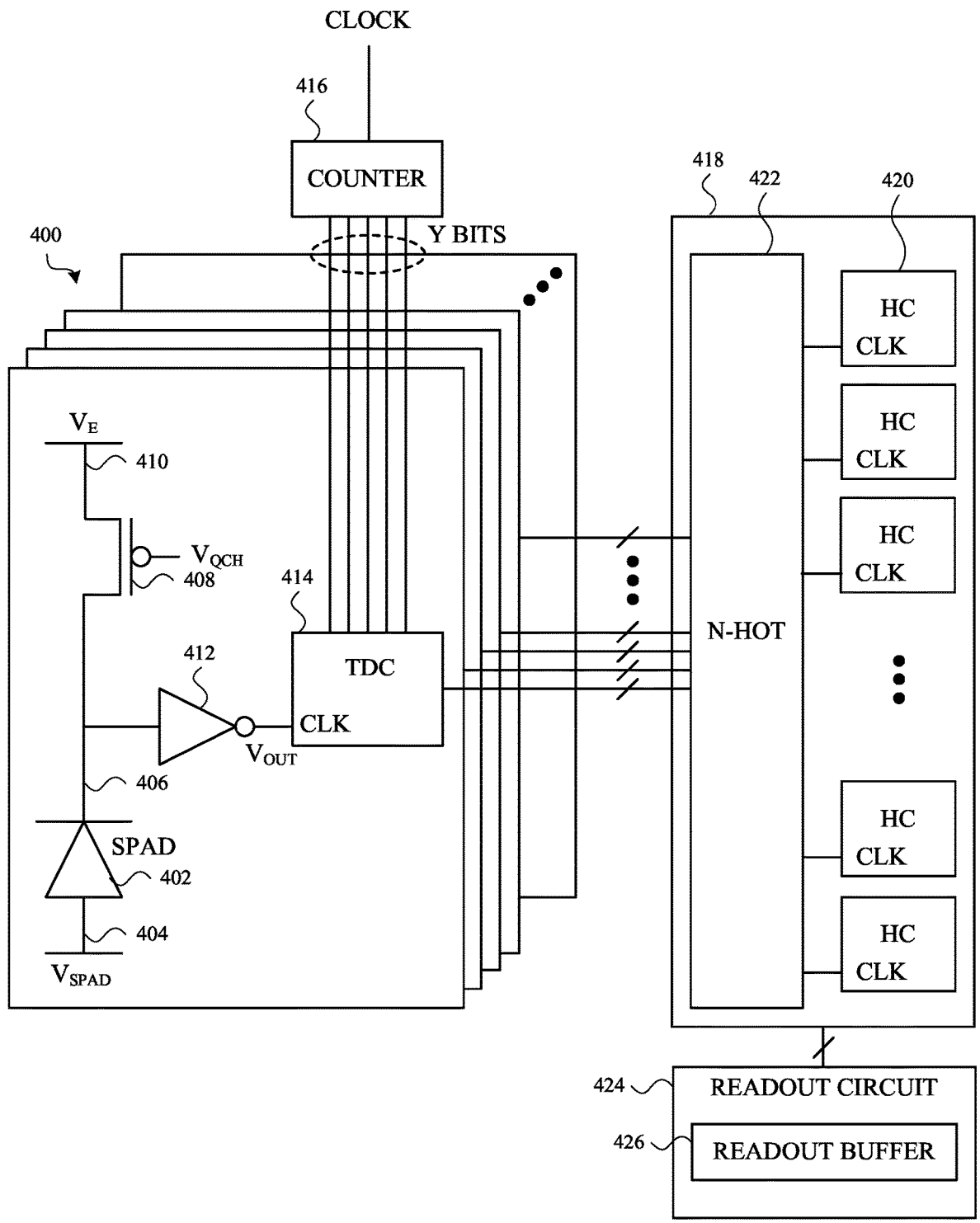
FIG. 4 shows an example schematic of an array of pixels in a SPAD-based photon detector.

FIG. 4 shows an example schematic of an array of pixels 400 in a SPAD-based photon detector. The array of pixels 400 may in some cases be an array of pixels in one of the cameras or detectors described with reference to FIGS. 1A-3.

Each pixel 400 in the array of pixels may include a SPAD 402. The SPAD 402 may be coupled between first and second nodes 404, 406, one of which is configured to be biased to a high voltage ($V_{SPAD}$) and one of which is an intermediate node. A SPAD quenching circuit 408 (e.g., a transistor driven by the voltage $V_{QCH}$) may be coupled between the second node 406 (the intermediate node) and a third node 410. The third node 410 may be biased to a voltage, $V_E$.

The SPAD 402 may be reset by the SPAD quenching circuit 408. Upon one or a small number of photons impinging on the SPAD 402, an avalanche may occur within the SPAD 402 and the SPAD 402 may generate an avalanche timing output signal (e.g., a rising edge of $V_{OUT}$) on the second node 406 (the intermediate node). Subsequently, the quenching circuit 408 may once again reset the SPAD 402.

The second node 406 (the intermediate node) may be coupled to the input of a buffer 412. The output of the buffer 412 may be coupled to the clock input of a TDC 414 (e.g., a latch). The TDC 414 may receive a sequence of time references, and upon the SPAD's generation of the avalanche timing output signal, the TDC 414 may latch a current timing reference in the sequence of timing references. The sequence of time references may in some cases be generated by a counter 416 driven by a clock that updates its count in response to a received clock signal, CLOCK. In some cases, the output of the counter may be provided to a group of TDCs 414.

The latched timing reference may serve as an index or address for addressing one of a number of memory locations 420 (or memory addresses, or histogram counts (HCs)) in a memory 418. The memory 418 may be variously implemented as a random access memory (RAM), a set of counters (e.g., counter circuits), and so on. The memory 418 may include a memory addressing and updating circuit 422, which in some cases may take the form of a one-hot decoder that receives a timing reference from the TDC 414 and uses the timing reference to pulse the clock input of a corresponding counter circuit in the memory 418. Upon being pulsed, the counter circuit may advance (e.g., increment, decrement, hop, etc.) to a next state in its count. Alternatively, the memory addressing and updating circuit 422 may take the form of a row/column memory decoder in combination with a read/write interface, adder, and so on, though latency requirements will typically dictate a simpler form of memory and memory addressing and updating circuit.

In some embodiments, a SPAD 402, quenching circuit 408, and TDC 414 may be provided per pixel 400 in the array of pixels, but the memory 418 may be shared by a group of pixels.

A readout circuit 424 may be coupled to the memory 418. In some embodiments, the readout circuit 424 may be configured to shift a set of counts into a buffer 426, which buffer 426 may be read while a next set of counts is being collected.

The array of pixels 400 may include a set of SPADs 402, a set of buffers 412, and a set of TDCs 414, as shown. All or a subset of the pixels 400 may share the counter 416, memory 418, and readout circuit 424. Alternatively, other arrangements are possible.

Figure 5:
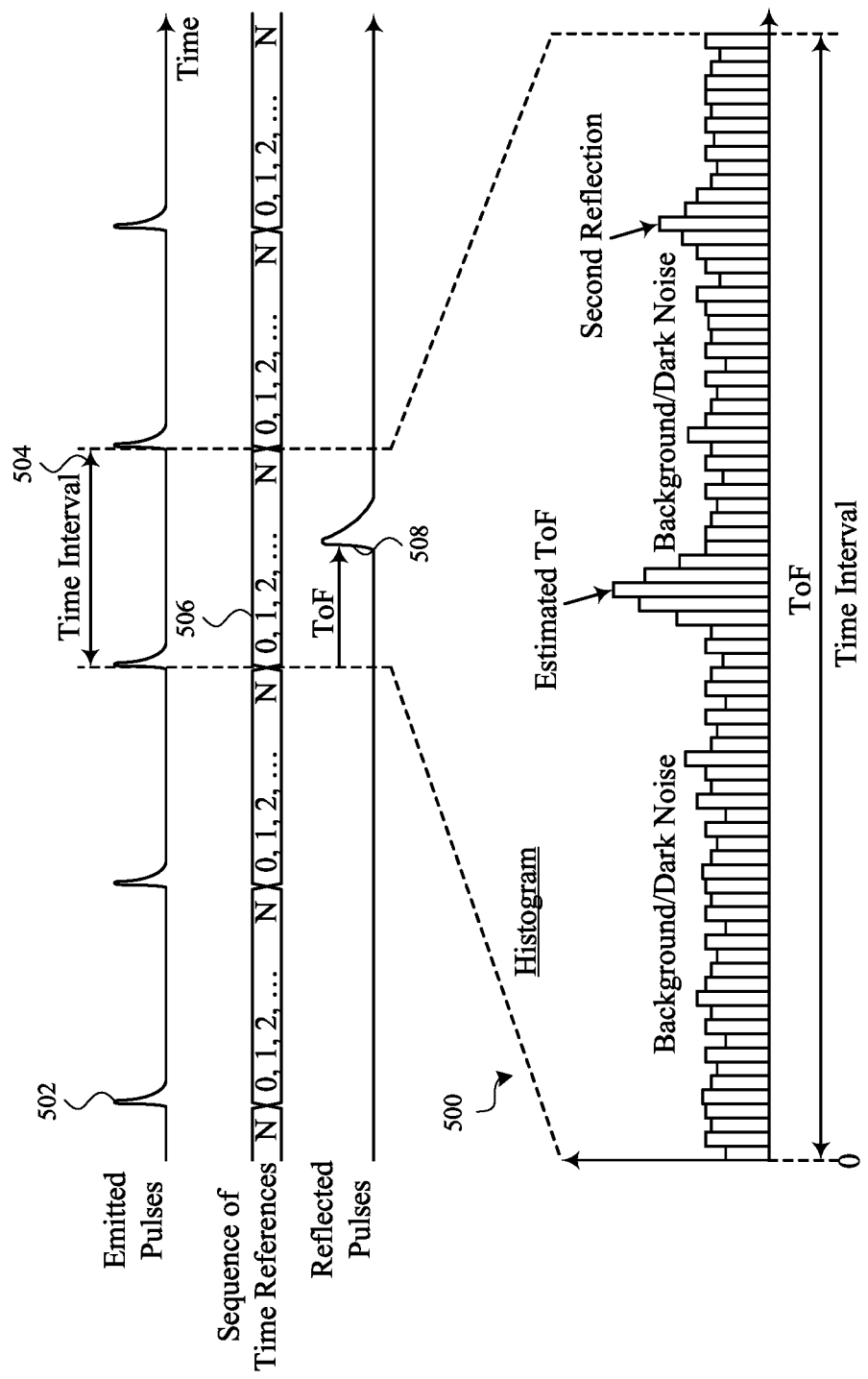
FIG. 5 shows an example timing relationship between various components in a SPAD-based photon detector, and an example time-of-flight histogram that may be generated from the output of a SPAD in such a sensor.

FIG. 5 shows an example timing relationship between various components in a SPAD-based photon detector. FIG. 5 also shows an example ToF histogram 500 that may be generated from the output of a SPAD in such a sensor.

As described with reference to FIGS. 2 and 3, a SPAD-based depth sensor may include an electromagnetic radiation source that may emit, in response to be configured by a processor, a sequence of electromagnetic radiation pulses 502. The pulses of electromagnetic radiation 502 may in some cases be equally spaced in time, and may be separated by a regular time interval 504 (e.g., a PRI). In other cases, the pulses 502 may be emitted at select times that are not at a regular time interval (i.e., separated by different time intervals).

During or after the emission of each pulse 502, or in some cases before emission of the pulse 502, but during a time interval in which the pulse 502 is emitted, a sequence of time references 506 may be provided to a TDC coupled to a SPAD. The sequence of time references 506 may have a known relationship to the time interval in which the pulse 502 is emitted, and a known relationship to the pulse 502. The known relationship may be established, for example, by starting the sequence of time references 506 (e.g., resetting or initializing a counter that generates the sequence of time references 506) in sync with the emission time of the pulse 502. The sequence of time references 506 is shown as a sequence of integer values in FIG. 5 (e.g., 0, 1, 2, . . . ), but may take the form of a binary count or other sequence within a SPAD-based depth sensor.

An emitted pulse of electromagnetic radiation 502 may propagate into a FoV unless or until it impinges on an object in the FoV, in which case a portion or all of the photons in the pulse 502 may reflect toward a SPAD of the depth sensor as a reflected pulse 508. Upon one or a small number of photons being received by (or arriving at) the SPAD, the SPAD may experience an avalanche condition and generate an avalanche timing output signal in response to the avalanche condition. Upon receipt of the avalanche timing output signal, a TDC may capture (e.g., latch) a current time reference in the sequence of time references. The captured (e.g., latched) time reference may be used to update the histogram 500.

As shown, the histogram 500 may include a set of memory locations (e.g., memory addresses or bins) that store a respective set of counts. Each count may represent a number of time intervals, in a set of time intervals, in which the SPAD received one or more photons at a particular time of arrival (or range of times of arrival) and experienced an avalanche condition. Given a known time at which a pulse of electromagnetic radiation 502 was emitted during a particular time interval, the time reference captured by a TDC during the time interval, and a known relationship between the emission time of the pulse of electromagnetic radiation 502 and the sequence of time references 506, a round-trip ToF of a photon in the emitted pulse 502 may be estimated or determined. Thus, each memory location or count may correspond to a ToF (or range of ToFs). A maximum count may typically be assumed to be the ToF of a photon reflecting off an object in a FoV. Lower counts may typically be assumed to be noise (e.g., reflections off of particles or other small objects passing through the FoV), secondary reflections of photons off the object, and so on.

Although FIG. 5 specifically shows a ToF histogram, a histogram may be more generally constructed for photon ToAs (with a photon ToF being considered one type of photon ToA). For example, a photon detector may be used to detect photons in the absence of intentionally-emitted pulses of electromagnetic radiation. That is, a SPAD may be enabled to detect photons in each of a set of time intervals, and a histogram may be constructed for photon ToAs during the set of time intervals. Such a photon detector may be used, for example, to detect the distance to a source of the photons, an average time between photon emissions, and so on. The photon ToAs may also be used, for example, to synchronize the photon detector or another device to a sequence of photon emissions.

Figure 6:
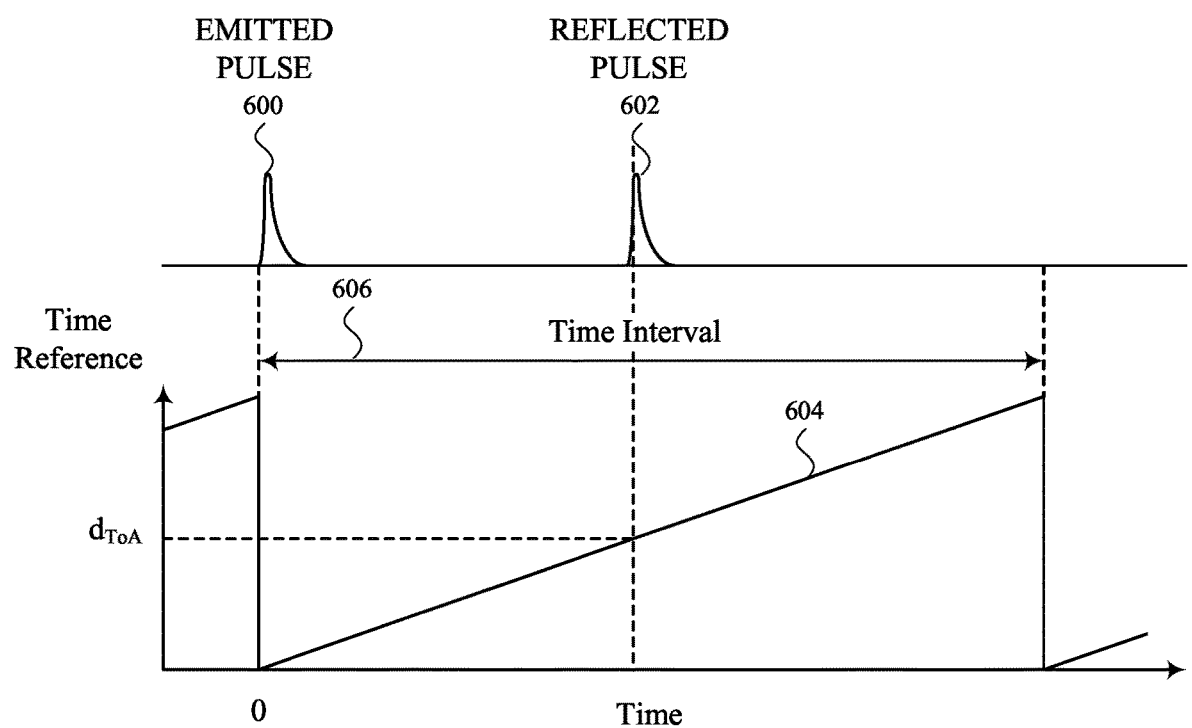
FIG. 6 shows, for a pixel, an example relationship between an emitted pulse of electromagnetic radiation, a reflected pulse of electromagnetic radiation, and a sequence of time references received by a TDC.

FIG. 6 shows, for a pixel, an example relationship between an emitted pulse of electromagnetic radiation 600, a reflected pulse of electromagnetic radiation 602, and a sequence of time references 604 received by a TDC. In some cases, the emitted pulse 600, reflected pulse 602, and sequence of time references 604 may be the emitted pulse, reflected pulse, and sequence of time references described with reference to FIG. 5.

As shown, the sequence of time references 604 may form a ramp (or stepped ramp) of time references between the start and end of a time interval 606 in which the pulse 600 is emitted. Alternatively, the sequence of time references may be any known (or determinable) sequence of incrementing, decrementing, hopping, or pseudo-random time references, which time references may be times, values of a count that are generated or received in sync with a clock, or any other values (e.g., binary values) that are generated or received in sync with a clock). Upon arrival of the returned pulse 602, a SPAD may generate an avalanche timing output signal, and the TDC may capture (e.g., latch) a current time reference in the sequence of time references 604 at a time 608. The current time reference (or time 608) may correspond to a particular ToA ($d_{ToA}$) 610.

In some cases, a histogram, such as the histogram described with reference to FIG. 5, can be constructed at a desired resolution. However, each additional memory location (or count) on which the histogram is based increases the area of the memory used to maintain the counts, which in turn can increase the cost of the memory and/or decrease the performance of the memory (e.g., due to lengthier conductor routes). Additionally, the number of time intervals on which the histogram is based generally increases the required depth (or number of bits) of each memory location or count (e.g., memory locations or counts that do not have enough depth can saturate and reduce the resolution of the histogram). Memory locations or counts having greater depth can also increase the area of the memory used to maintain the counts, increase the cost of the memory, and/or decrease the performance of the memory. Tradeoffs may therefore have to be made between histogram resolution, memory area, memory cost, and memory performance.

One way to reduce the area or cost of a histogram memory is to simply reduce its size or depth, consequently reducing the resolution or depth of (number of time intervals represented by) a histogram. However, such sacrifices are not acceptable in some applications.

Another way to reduce the area or cost of a histogram memory is to map multiple time references to each memory location. Thus, each memory location corresponds to a range (or broader range) of ToAs. However, such a many-to-one mapping reduces the resolution of a resultant histogram. In some cases, such a memory management scheme can be deployed, at times, to increase the range of detectable ToAs while reducing the resolution of detectable ToAs; and at other times, the number of time references mapped to a memory location can be reduced (even to a 1-to-1 mapping) to improve a histogram's resolution over a smaller range of detectable ToAs.

Yet another way to reduce the area or cost of a histogram memory is to use a non-linear TDC that provides a non-linear mapping of time references to memory locations. Thus, for some ranges of ToAs, the TDC may map time references to memory locations with a one-to-one mapping or other higher resolution mapping, but for other ranges of ToAs, the TDC may map time references to memory locations using a many-to-one or lower resolution mapping. In some cases, a TDC may provide more than two mapping schemes.

Figure 7:
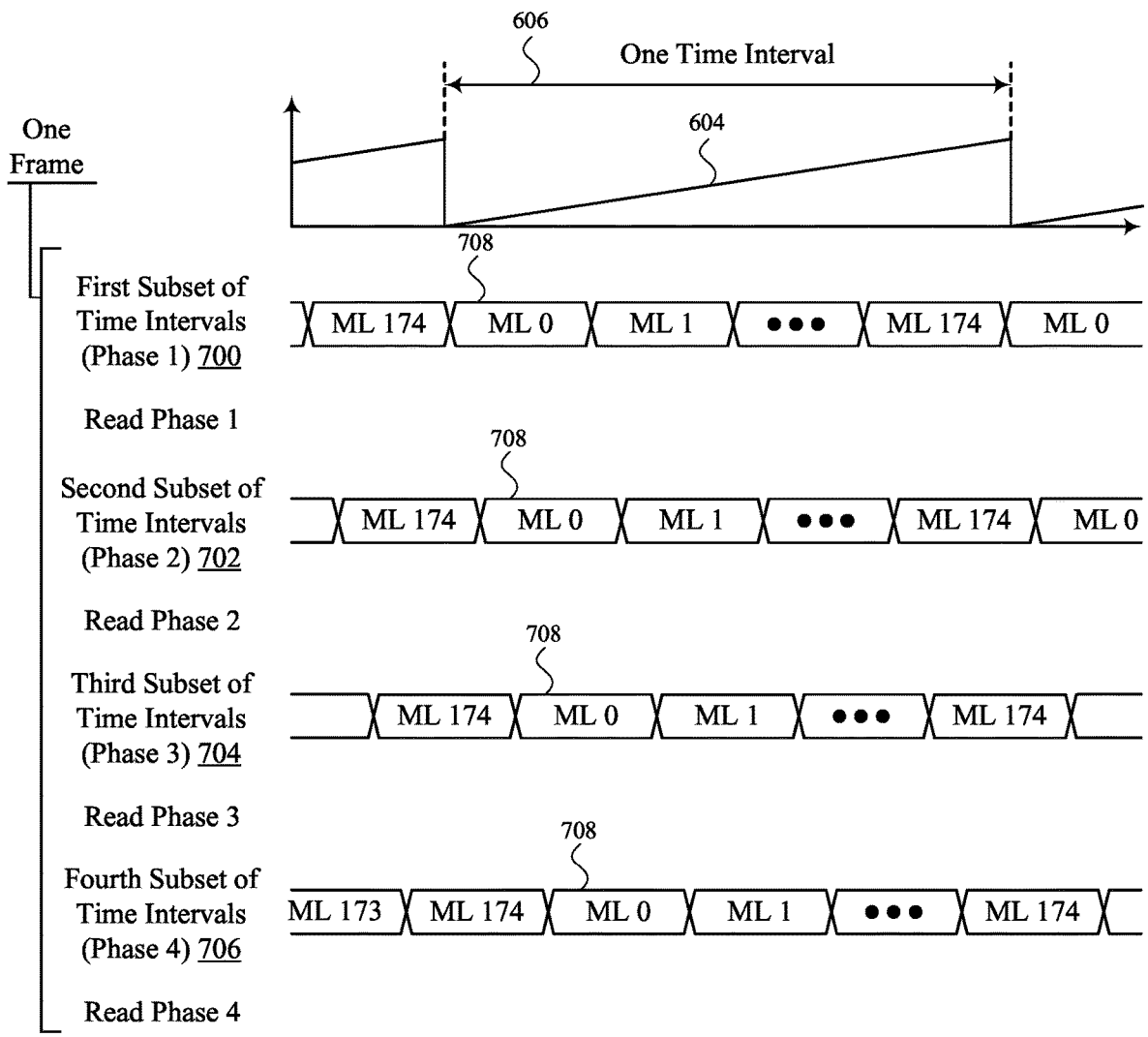
FIGS. 7-9 show an example way to reduce the area or cost of a histogram memory.
Figure 8:
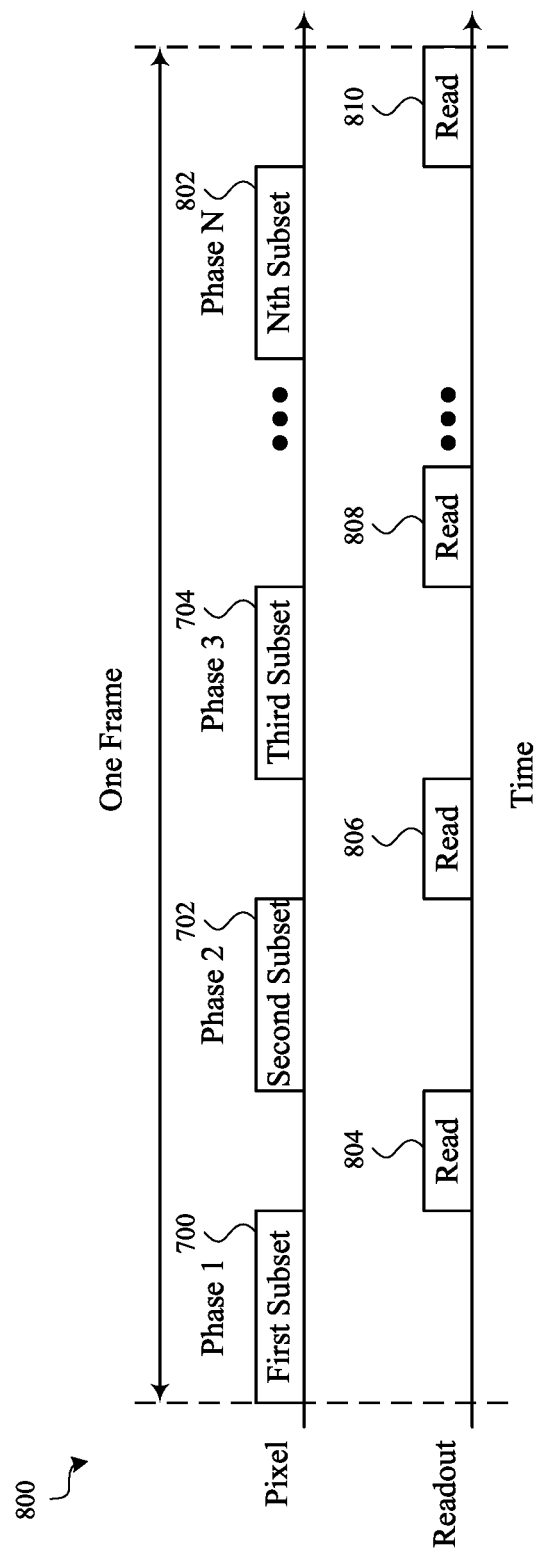
Figure 9:
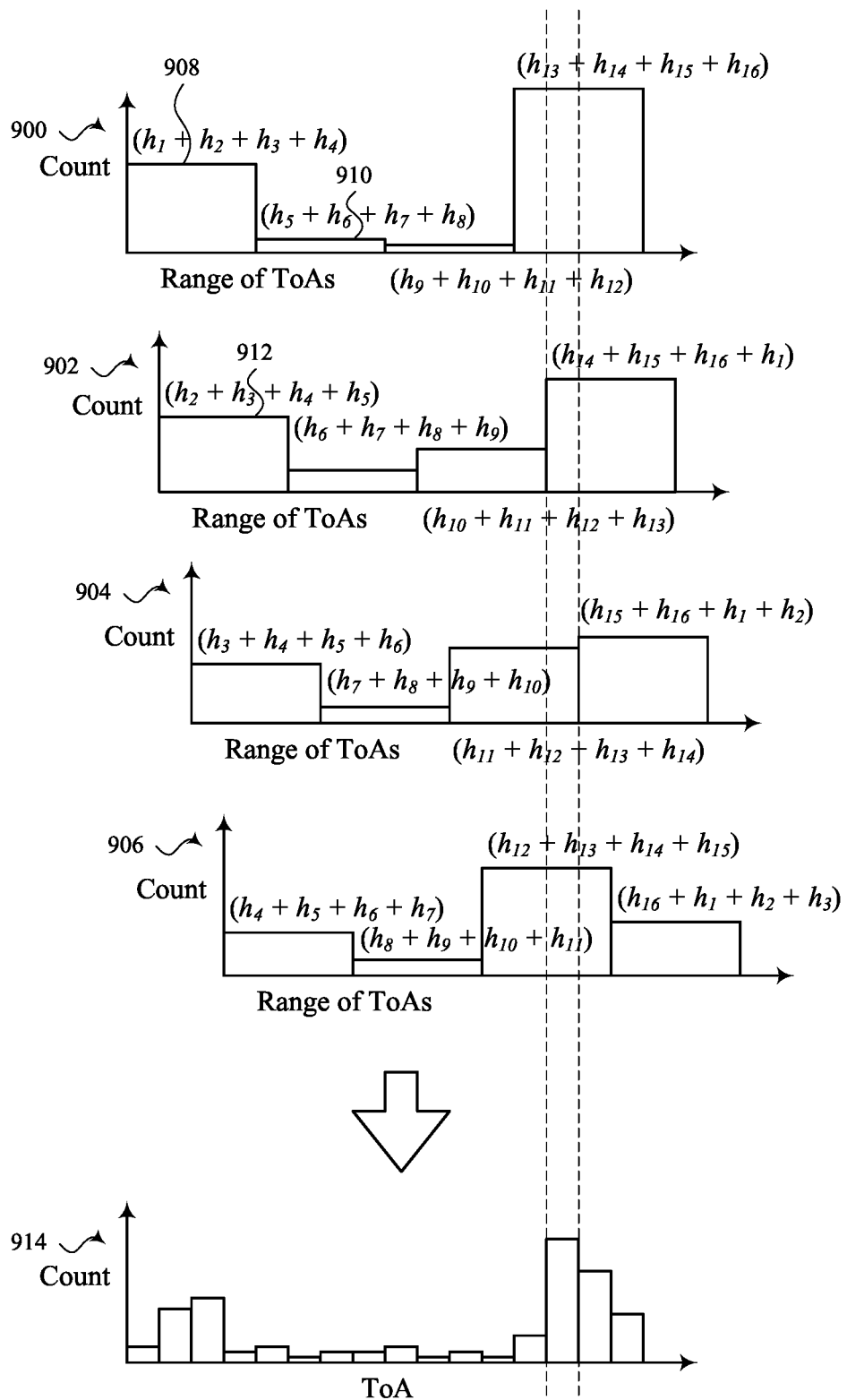

FIGS. 7-9 show another example way to reduce the area or cost of a histogram memory. In accordance with the technique described with reference to FIGS. 7-9, a set of time intervals for which a histogram is built is divided into two or more subsets of time intervals, and a mapping of time references to memory locations is phase shifted from one subset of time intervals to another. By way of example, FIGS. 7-9 show four subsets of time intervals, but the principles described with reference to FIGS. 7-9 apply to any number of two or more subsets of time intervals.

FIG. 7 shows the time interval 606 and sequence of time references 604 described with reference to FIG. 6. By way of example, the sequence of time references 604 is shown to be a ramped, incrementing sequence of time references. However, the sequence of time references 604 may be any known (or determinable) sequence of time references.

During each subset of time intervals, multiple time references (or timings of an avalanche timing output signal) are mapped to each memory location or count (i.e., a greater number of time references is mapped to a smaller number of memory locations or counts). By way of example, four time references may be mapped to each memory location.

During a first subset of time intervals 700, time references may be mapped to memory locations ((ML), or counts, or photon ToA ranges) 708 in accordance with a first phase mapping. During a second subset of time intervals 702, distinct from the first subset of time intervals, time references may be mapped to memory locations 708 in accordance with a second phase mapping (i.e., a second phase mapping that is phase-shifted with respect to the first phase mapping). During a third subset of time intervals 704, distinct from the first and second subsets of time intervals, time references may be mapped to memory locations 708 in accordance with a third phase mapping (i.e., a third phase mapping that is phase-shifted with respect to the first and second phase mappings). During a fourth subset of time intervals 706, distinct from the first, second, and third subsets of time intervals, time references may be mapped to memory locations 708 in accordance with a fourth phase mapping (i.e., a fourth phase mapping that is phase-shifted with respect to the first, second, and third phase mappings). By way of example, the first, second, third, and fourth phase mappings may be offset from each other by one time reference though, in alternative embodiments, other offsets may be used.

The phase-shifted mappings of the time references to memory locations have the effect of phase-shifting a set of photon ToA ranges with respect to the set of memory locations. Stated differently, the memory locations are associated with different (and phase-shifted) photon ToA ranges during different subsets of time intervals.

There are various ways to achieve the phase offsets shown in FIG. 7. In some embodiments, the phase offsets may be achieved by resetting the counter described with reference to FIG. 4 at different times, or initializing the counter with different values (e.g., a different starting time reference), prior to the time intervals in the different subsets of time intervals. By adjusting the reset or initialization of the counter, for example, the phase of the sequence of time references can be shifted, and the different phase mappings (or phase offsets) described herein inherently occur. Alternatively, and in some embodiments, a programmable delay element may be introduced between the buffer and TDC described with reference to FIG. 4, and the delay may be changed for different subsets of time intervals. For one subset of time intervals (e.g., the first subset of time intervals), the delay element may be programmed for no delay. As another alternative, phase offsets may be achieved by providing a programmable TDC or memory addressing and updating circuit. For example, the memory addressing and updating circuit may compute a histogram address as Memory Address=$d_{ToA}-(M-1)$ where dTOA is the output of the TDC, and M is the Mth subset of time intervals (M=1, 2, 3, . . . ).

At the end of each subset of time intervals shown in FIG. 7, the set of counts stored in the set of memory locations may be read and cleared. As shown in the example timing diagram 800 in FIG. 8, each of the first, second, third, and up to Nth subsets of time intervals 700, 702, 704, 802 may be followed by a respective read period 804, 806, 808, 810 during which the set of counts may be read and cleared. In some cases, the set of counts may only be read into a buffer during a read period, and the buffer may then be read in parallel with a next subset of time intervals, while the set of counts is being updated for the next subset of time intervals.

FIG. 9 shows example sets of counts read during each of the read periods described with reference to FIG. 8, and an example moving average histogram generated using the sets of counts. In particular, FIG. 9 shows a first set of counts 900 read after the first subset of time intervals 700, a second set of counts 902 read after the second subset of time intervals 702, a third set of counts 904 read after the third subset of time intervals 704, and a fourth set of counts 906 read after the fourth subset of time intervals 706.

By way of example, a first count 908 in the first set of counts 900 is a count of ToAs corresponding to four time references in the sequence of time references. Stated differently, the first count 908 is a sum of $h_1$, $h_2$, $h_3$, and $h_4$, where $h_1$ is a count of ToAs corresponding to a first time reference, $h_2$ is a count of ToAs corresponding to a second time reference, $h_3$ is a count of ToAs corresponding to a third time reference, and $h_4$ is a count of ToAs corresponding to a fourth time reference. Similarly, a second count 910 in the first set of counts 900 is a count of ToAs corresponding to a next four time references in the sequence of time references, or the sum of $h_5$, $h_6$, $h_7$, and $h_8$, and so on.

Although the sets of counts 900-906 are read from the same memory locations (or memory addresses, or bins), the sets of counts 900-906 are shown laterally offset (or phase-shifted) in FIG. 9, to illustrate the respective phase offsets in their time reference to memory location mappings. In particular, the first count 912 in the second set of counts 902, which is a sum of $h_2$, $h_3$, $h_4$, and $h_5$, is offset by one-quarter of the width of the first count 908 in the first set of counts 900, and so on.

The sets of counts 900-906 may be received and combined (e.g., averaged) by a processor to build a moving average histogram 914 of photon ToAs detected by a SPAD. Of note, the moving average histogram 914 has a number of photon ToA bins (or a resolution) that is greater than the number of counts in (or resolution of) each set of counts 900-906.

Figure 10:
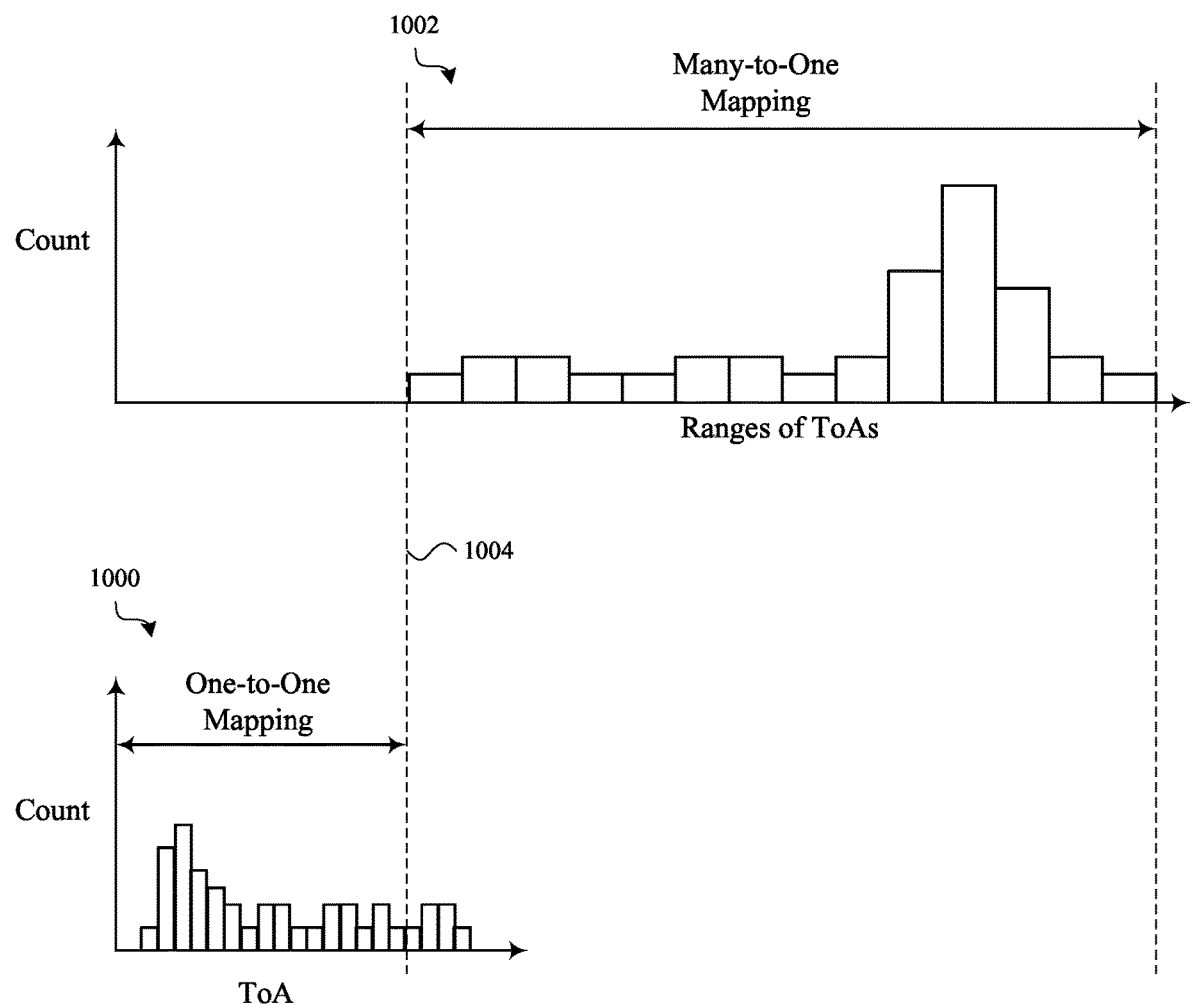
FIG. 10 shows an example variation of the technique described with reference to FIGS. 7-9.

FIG. 10 shows an example variation of the technique described with reference to FIGS. 7-9. In accordance with the technique described with reference to FIG. 10, a non-linear TDC is used. In this manner, some time references in a sequence of time references (or timings of an avalanche timing output signal) may be mapped to memory locations using a one-to-one mapping 1000, and other time references in the sequence of time references (or timings of an avalanche timing output signal) may be mapped to memory locations using a many-to-one mapping 1002. In some cases, different subsets of the latter time references may be mapped to memory locations using different many-to-one mappings. For each group of time references that is mapped to a group of memory locations using a many-to-one mapping, the mapping may be phase-shifted between different subsets of time interval, and a moving average histogram may be constructed, as described with reference to FIGS. 7-9.

In some embodiments, some of the time references (e.g., those near the boundary 1004), may be included in both the one-to-one mapping 1000 and the many-to-one mapping 1002. Such an overlap ensures there is no dead space in which a ToA event might be missed.

Although FIG. 10 shows one example output of a non-linear TDC, numerous permutations are envisioned. For example, there may be two or more different many-to-one mappings. In some cases, there may be two or more different many-to-one mappings and no one-to-one mapping.

Figure 11:
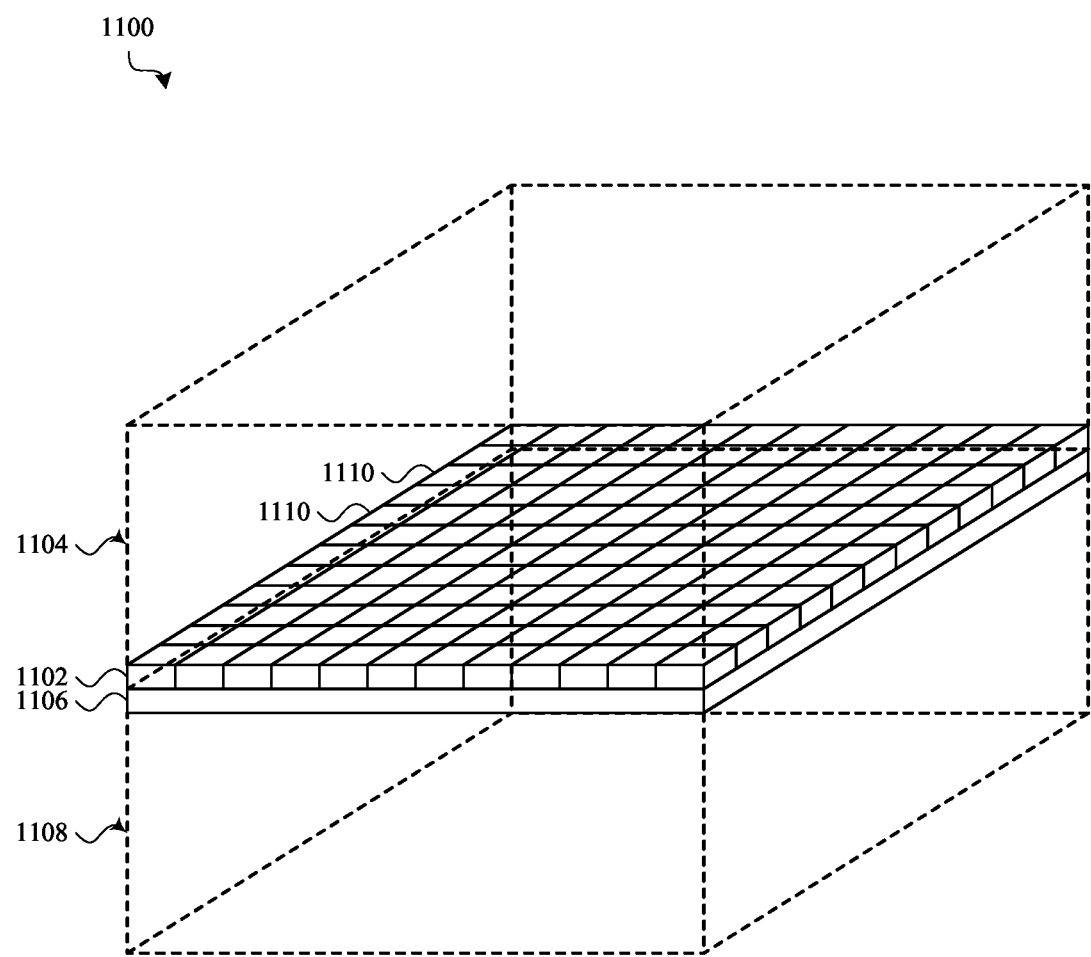
FIG. 11 shows an example stacked construction for a SPAD-based photon detector.

FIG. 11 shows an example stacked construction for a SPAD-based photon detector 1100. In some cases, the SPAD-based photon detector 1100 may be included in a SPAD-based depth sensor. The example construction shown in FIG. 11 may be used for any of the SPAD-based photon detectors, depth sensors, or image sensors described with reference to FIGS. 1A-4.

As shown, the SPAD-based photon detector 1100 may include at least a first layer 1102 (e.g., only the first layer 1102, or a first set of layers 1104 including the first layer 1102) and at least a second layer 1106 (e.g., only the second layer 1106, or a second set of layers 1108 including the second layer 1106). The first and second layers 1102, 1104 may be stacked and, in some cases, may be stacked with other layers. The other layers may be layers in the first and/or second set of layers 1104, 1108, and/or other layers. The other layers may be positioned on the first layer 1102, between the first and second layers 1102, 1106, or below the second layer 1106. In some embodiments, all of the layers may be included in a single integrated circuit (IC) chip and/or on a single substrate. In other embodiments, the layers may be distributed across different, stacked chips or substrates. For example, the first set of layers 1104 may be included in a first chip, which first chip is stacked with a second chip including the second set of layers 1108.

The first layer 1102, or first set of layers 1104 may be subdivided into an array of pixels 1110. Each pixel 1110 may include a respective SPAD in a set of SPADs. In some embodiments, the set of SPADs may be the set of SPADs described with reference to FIG. 4.

The second layer 1106, or second set of layers 1108, may include a set of SPAD quenching circuits, a set of buffers, a set of TDCs, and/or a memory. Each quenching circuit in the set of quenching circuits, buffer in the set of buffers, and TDC in the set of TDCs may be paired with a pixel 1110 in the array of pixels. In some embodiments, the set of quenching circuits, set of buffers, set of TDCs, and memory may be the set of quenching circuits, set of buffers, set of TDCs, and memory described with reference to FIG. 4.

Although each quenching circuit, buffer, and TDC may be paired with a respective pixel 1110 in the array of pixels, each quenching circuit, buffer, and TDC need not be positioned within the lateral boundaries of its respective pixel 1110 in the first layer 1102 (or first set of layers 1104). Example layouts of the second layer 1106 (or second set of layers 1108) are shown in FIGS. 12A and 12B.

Figure 12A:
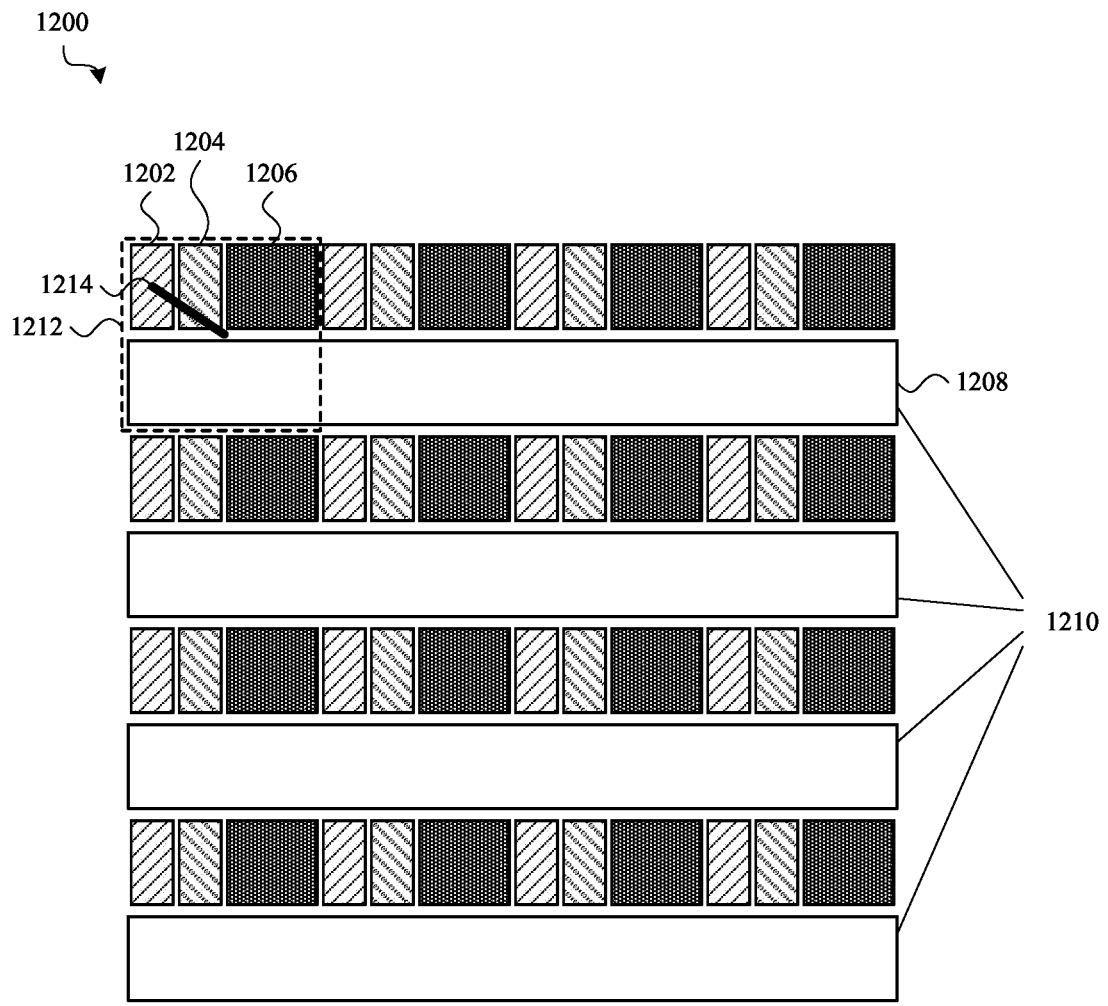
FIG. 12A shows a first example layout of the second layer described with reference to FIG. 11, or an example plan projection of the second set of layers described with reference to FIG. 11.
Figure 12B:
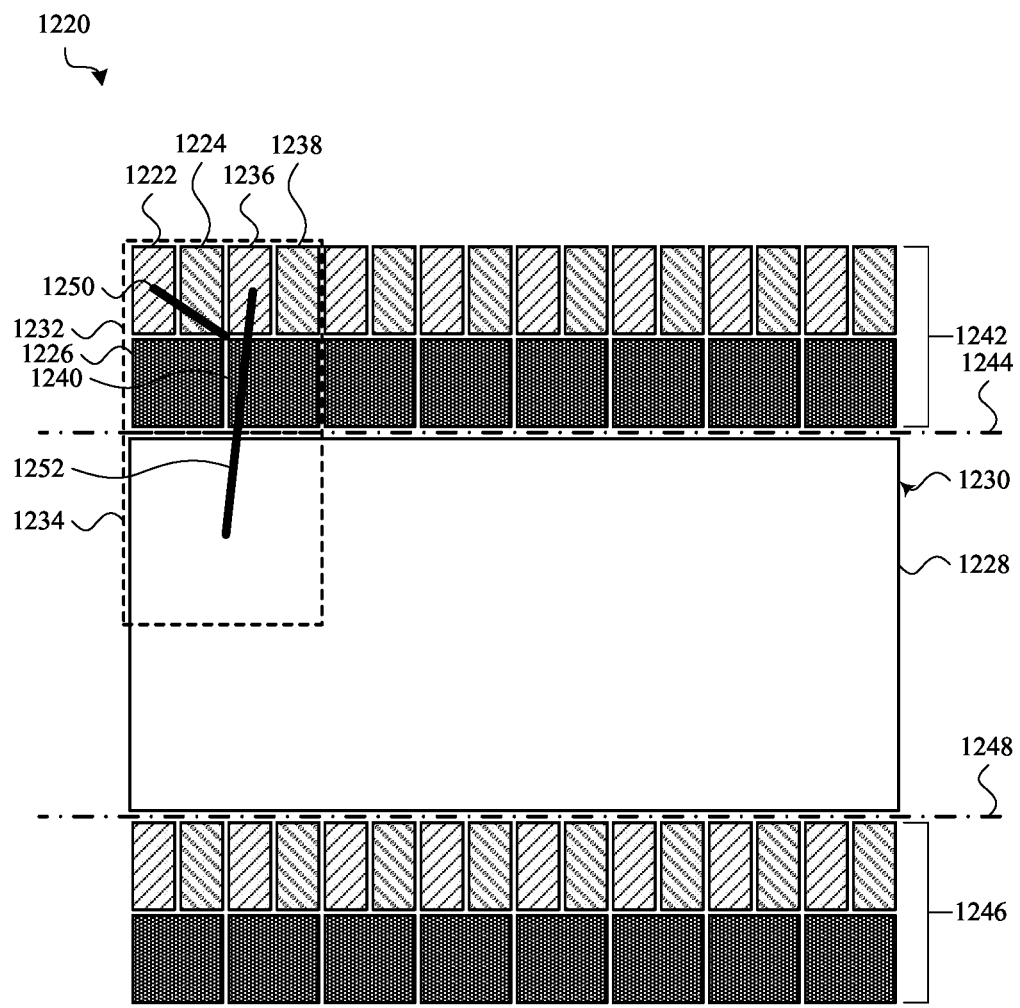
FIG. 12B shows a second example layout of the second layer described with reference to FIG. 11, or an example plan projection of the second set of layers described with reference to FIG. 11.

FIG. 12A shows a first example layout 1200 of the second layer 1106 described with reference to FIG. 11, or an example plan projection of the second set of layers 1108 described with reference to FIG. 11.

As shown, the second layer 1106 (or second set of layers 1108) may include a set of SPAD quenching circuits 1202, a set of buffers 1204, a set of TDCs 1206, and portions 1208 of a memory 1210. A set of SPADs may be incorporated into one or more layers disposed over or under the second layer 1106 (or second set of layers 1108). An example lateral boundary of a pixel 1212, in an array of pixels, is shown. The pixel 1212 may include a SPAD in the set of SPADs. A SPAD quenching circuit 1202, buffer 1204, and/or TDC 1206 for the pixel 1212 may be included within the pixel 1212 (i.e., within the lateral boundary of the pixel 1212, which lateral boundary is presumed to project into the second layer 1106 or second set of layers 1108). A portion 1208 of the memory 1210 may also be included within the pixel 1212. Alternatively, the components of the second layer 1106 (or second set of layers 1108) may be offset with respect to the array of pixels, such that the SPAD quenching circuit 1202, buffer 1204, and/or TDC 1206 overlaps the pixel 1212 with which it is paired.

Each pixel 1212 and the components with which it is paired may be laid out similarly.

A potential advantage of the layout 1200 is that, for each pixel 1212, the length of the conductor routing 1214 between the pixel's SPAD (in the first layer) and quench circuit (in the second layer) is relatively short, and in some cases minimized. However, the portions 1208 of the memory 1210 are not contiguous and the layout of the memory 1210 may not be optimal.

The layout techniques described with reference to FIG. 12A may be implemented for the entirety of the second layer 1106 or second set of layers 1108 described with reference to FIG. 11. In addition, and in some embodiments, a subset of pixels (e.g., an N×N subset of pixels) within a larger array of pixels may share a portion of the memory 1210 (e.g., as described with reference to FIG. 4), and other subsets of pixels may share other portions of the memory 1210.

FIG. 12B shows a second example layout 1220 of the second layer 1106 described with reference to FIG. 11, or an example plan projection of the second set of layers 1108 described with reference to FIG. 11.

As shown, the second layer 1106 (or second set of layers 1108) may include a set of SPAD quenching circuits 1222, a set of buffers 1224, a set of TDCs 1226, and all or a portion 1228 of a memory 1230. A set of SPADs may be incorporated into one or more layers disposed over or under the second layer 1106 (or second set of layers 1108). A first example lateral boundary of a first pixel 1232, in an array of pixels, is shown. The first pixel 1232 may include a first SPAD in the set of SPADs. A second example lateral boundary of a second pixel 1234 is also shown. The second pixel 1234 may include a second SPAD in the set of SPADs.

A SPAD quenching circuit 1222, buffer 1224, and/or TDC 1226 for the first pixel 1232 may be included within the first pixel 1232 (i.e., within the lateral boundary of the first pixel 1232). However, instead of a portion 1228 of the memory 1230 being included within the first pixel 1232, a quenching circuit 1236, buffer 1238, and/or TDC 1240 for the second pixel 1234 may be included within the first pixel 1232.

For the second pixel 1234, a portion 1228 of the memory 1230 may be included within the pixel, but its quenching circuit 1236, buffer 1238, and/or TDC 1240 may be included in the first pixel 1232. Thus, different pixels may include different components. More generally, each quenching circuit in a first subset of quenching circuits may be included in, or overlap, the pixel with which it is paired, but each quenching circuit in a second subset of quenching circuits may be offset from, and may not overlap, the pixel with which it is paired. Similarly, each buffer and/or TDC in a first subset of buffers or TDCs may be included in, or overlap, the pixel with which it is paired, but each buffer and/or TDC in a second subset of buffers or TDCs may be offset from, and may not overlap, the pixel with which it is paired.

In some embodiments, the layout technique illustrated in FIG. 12B may allocate the portion 1228 of the memory 1230 to a subset of pixels in an array of pixels (e.g., to the pixels disposed over the components shown in FIG. 12B), and the quenching circuits, buffers, and/or TDCs that are paired with the subset of pixels may be disposed around the portion 1228 of the memory 1230. For example, and as shown, a first subset 1242 of the quenching circuits, buffers, and/or TDCs may be disposed on a first lateral side 1244 of the portion 1228 of the memory 1230, and a second subset 1246 of the quenching circuits, buffers, and/or TDCs may be disposed on a second lateral side 1248 of the portion 1228 of the memory 1230.

A potential advantage of the layout 1220 is that all or a portion 1228 of the memory 1230 is contiguous, which can improve memory performance. However, the length of the conductor routing 1250 between a pixel's SPAD and quench circuit may be relatively short for some pixels (e.g., the first pixel 1232), but relatively longer for other pixels (e.g., the length of the conductor routing 1252 for the second pixel 1234 may be longer than the length of the conductor routing 1250 for the first pixel 1232). The additional conductor routing length for some pixels can result in additional capacitance and worse timing performance for these pixels. The different timing performance for different pixels, if left uncorrected, can also reduce the performance and uniformity (from one pixel to another) of a SPAD-based photon detector as a whole.

The layout techniques described with reference to FIG. 12B may be implemented for a subset of pixels (e.g., an N×N subset of pixels) within a larger array of pixels (e.g., as described with reference to FIG. 4), and replicated for other subsets of pixels in the array of pixels.

FIG. 13 is a table 1300 that shows how multi-phase sampling of histogram counts (e.g., in accordance with techniques such as those described with reference to FIG. 7-10) can be combined with pixel binning (i.e., the sharing of histogram counts by a set of pixels, or set of SPADs, during different sets of time intervals (e.g., as described with reference to FIGS. 4 and 11-12B)) to increase the number of histogram counts available per pixel in an array of pixels, thus enabling an increase in histogram resolution.

A first column 1302 in the table 1300 shows an example density of histogram counts (HCs) in a SPAD-based photon detector. The density of HCs may be determined by dividing the total number of HCs implemented on a photon detector by the total number of pixels in the photon detector. By way of example, densities of 1, 2, 3, 4, and N HC/pixel are shown. Note that the density shown in the first column 1302 is not necessarily the number of HCs that may be available to (or used by) a pixel when building a histogram for the pixel.

A second column 1304 of the table 1300 shows an example number of phases (or phase offsets, or subsets of time intervals, or sub-frames) for which the set of HCs available to a pixel are updated and read out of the photon detector's memory. By way of example, 1 and 4 phases are shown.

Third through eighth column headers 1306, 1308, 1310, 1312, 1314, 1316 of the table 1300 show different pixel binning factors. For example, the third column header 1306 shows a pixel binning factor of 1 (effectively no pixel binning). The fourth column header 1308 shows a pixel binning factor of 4 (e.g., for a 2×2 array or other selection of pixels). The fifth through eighth column headers 1310, 1312, 1314, 1316 respectively show pixel binning factors of 9, 16, 25, and $M^2$.

The rows of the table 1300 show the number of HCs available to each pixel when building a histogram for the pixel under various scenarios.

Figure 14:
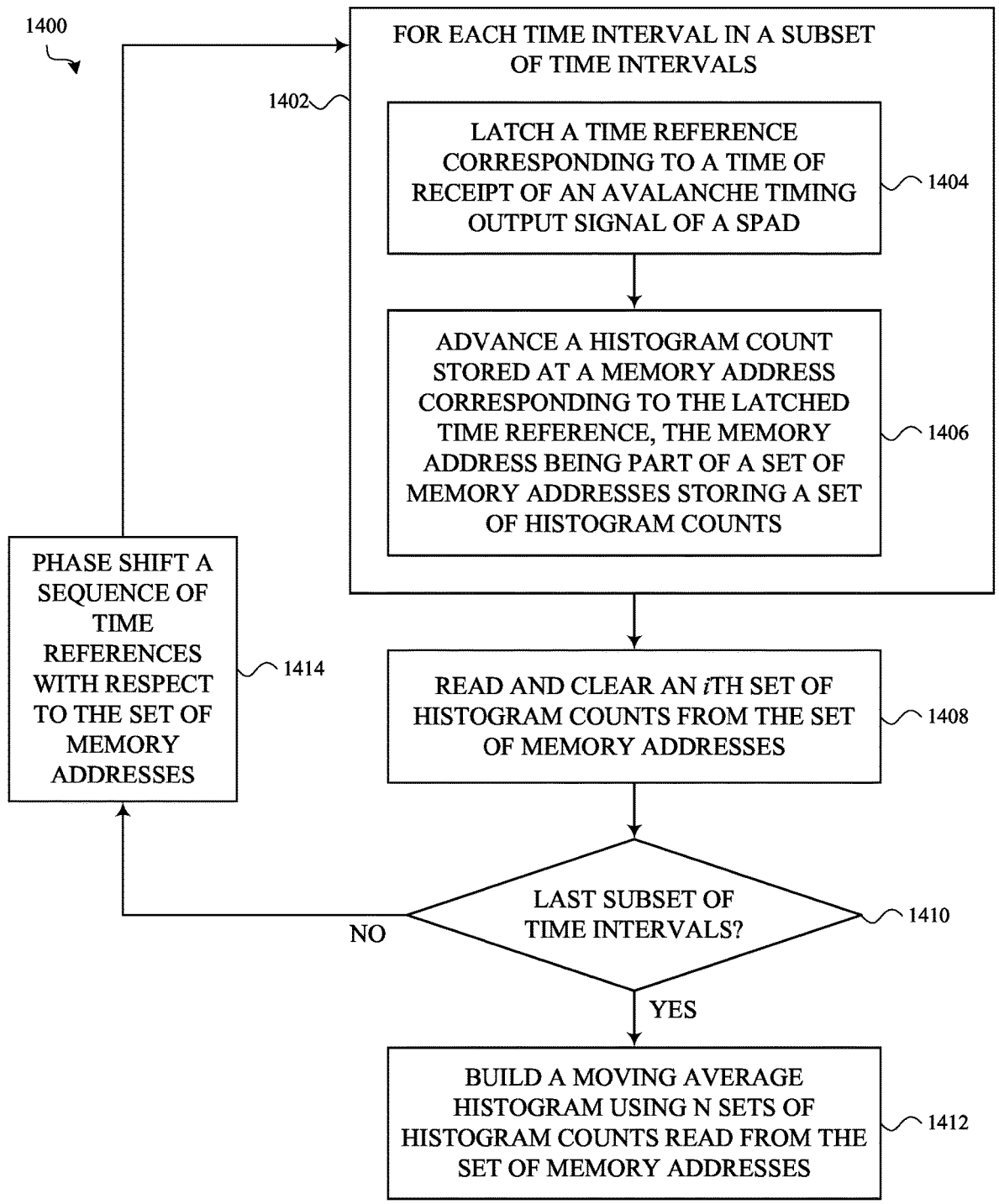
FIG. 14 shows an example method of building a moving average histogram of photon ToAs.

FIG. 14 shows an example method 1400 of building a moving average histogram of photon ToAs (which in some cases may be or indicate photon ToFs).

At block 1402, the method 1400 begins an iterative set of operations for each time interval in a subset of time intervals. The operations may be repeated, upon different arrivals at the block 1402, for a first subset of time intervals, a second subset of time intervals, a third subset of time intervals, and so on. In some embodiments, the operations may be repeated for four subsets of time intervals. In some examples, block 1402 may be repeated for each subset of time intervals described with reference to FIGS. 7-9.

At block 1404, within the block 1402, the method 1400 may include latching a time reference corresponding to a time of receipt of an avalanche timing output signal of a SPAD. The time reference may be part of a sequence of time references for the time interval, as described with reference to FIGS. 4, 7-9, and elsewhere herein. The operations at block 1404 may be performed, for example, by a TDC described herein.

At block 1406, within the block 1402, the method 1400 may include advancing a histogram count stored at a memory address corresponding to the latched time reference. The memory address may be part of a set of memory addresses storing a set of histogram counts. The memory address may correspond to a range of time references in the sequence of time references. The operations at block 1406 may be performed, for example, by the memory addressing and updating circuit (or one hot decoder) described herein.

At block 1408, and following the block 1402, the method 1400 may include reading and clearing an ith set of histogram counts from the set of memory addresses. The variable i may assume a value from 1 to N. The clearing of the first set of histogram counts may be performed as a result of the read operation, or as a separate operation following the read operation. When the operations at block 1402 are performed for a first subset of time intervals, the operations at block 1408 may be performed after the first subset of time intervals and before a second subset of time intervals, and may result in a first set of histogram counts being read from the set of memory addresses. When the operations at block 1402 are performed for a second subset of time intervals, the operations at block 1408 may be performed after the second subset of time intervals (and in some cases, before a third subset of time intervals), and may result in a second set of histogram counts being read from the set of memory addresses. When the operations at block 1402 are performed for a third subset of time intervals, the operations at block 1408 may be performed after the third subset of time intervals (and in some cases, before a fourth subset of time intervals), and may result in a third set of histogram counts being read from the set of memory addresses; and so on. The operations at block 1408 may be performed, for example, by a readout circuit and/or processor described herein.

At block 1410, the method 1400 may include determining whether the most recent subset of time intervals for which the operations at blocks 1402-1408 were performed is the last subset of time intervals in a set of time intervals (or in a frame). If yes, the method 1400 may continue at block 1412. If no, the method 1400 may continue at block 1414. The operations at block 1410 may be performed, for example, by a processor described herein.

At block 1412, the method 1400 may include building a moving average histogram using at least N sets of histogram counts read from the set of memory addresses. In some embodiments, this moving average histogram may be built using first and second sets of histogram counts, first through fourth sets of histogram counts, or any number of sets of histogram counts. The operations at block 1412 may be performed, for example, by a processor described herein.

At block 1414, the method 1400 may include phase-shifting the sequence of time references with respect to the set of memory addresses. In some embodiments, the phase-shifting may include shifting the sequence of time references with respect to each time interval in a next subset of time intervals (e.g., compared with a previous subset, or other subsets, of time intervals). For example, in the context of FIG. 4, the counter 416 may be reset at a different time, or initialized to a different value, in sync with the start of each time interval in the next subset of time intervals. In some embodiments, the phase-shifting may include delaying the avalanche timing output signals for time intervals in a next subset of time intervals (e.g., compared to the avalanche timing output signals of a previous subset, or other subsets, of time intervals). For example, in the context of FIG. 4, a programmable delay element between the buffer 412 and TDC 414 may be changed.

When the operations at block 1402 have been performed for a first subset of time intervals, the operations at block 1414 may be performed after the first subset of time intervals and for a second subset of time intervals, and so on. The operations at block 1414 may be performed, for example, by a processor described herein.

In some embodiments of the method 1400, and for each time interval for which the operations at block 1402 are performed, the method 1400 may include emitting a pulse of electromagnetic radiation having a known relationship to the sequence of time references. In this manner, the time of receipt of the avalanche timing output signal may indicate a ToF of at least one photon in the pulse of electromagnetic radiation.

In some embodiments, the method 1400 may include other operations, performed before, during, or after the operations described with reference to blocks 1402-1414. In some embodiments, the operations at some or all of blocks 1402-1414 may be performed in parallel, or in an overlapping manner.

Figure 15:
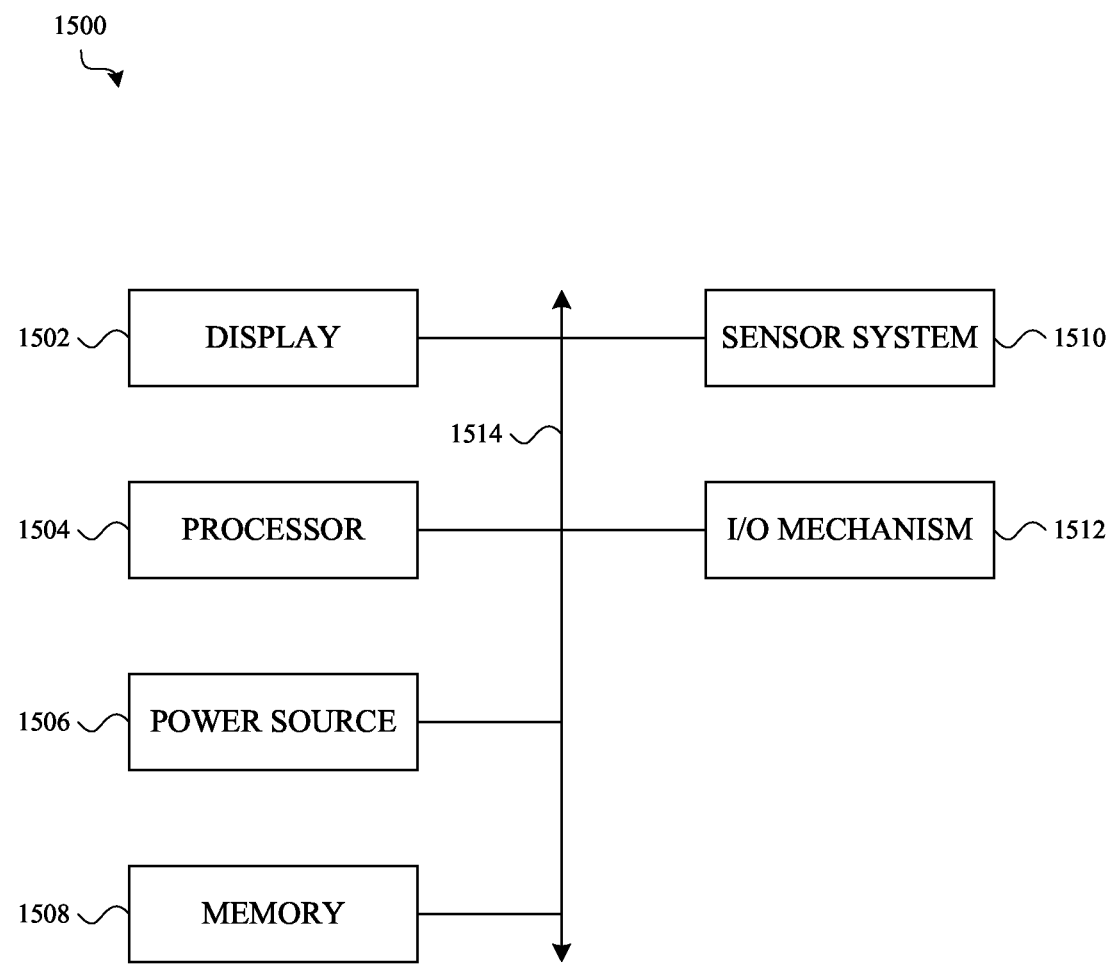
FIG. 15 shows a sample electrical block diagram of an electronic device that includes an image sensor.

FIG. 15 shows a sample electrical block diagram of an electronic device 1500 that includes a SPAD-based photon detector, such as a SPAD-based photon detector, 3D image sensor, or depth sensor described with reference to any of FIGS. 1A-4 or 11. The electronic device 1500 may take forms such as a hand-held or portable device (e.g., a smartphone, tablet computer, or electronic watch), a navigation system of a vehicle, and so on. The electronic device 1500 may include an optional display 1502 (e.g., a light-emitting display), a processor 1504, a power source 1506, a memory 1508 or storage device, a sensor system 1510, and an optional input/output (I/O) mechanism 1512 (e.g., an input/output device and/or input/output port). The processor 1504 may control some or all of the operations of the electronic device 1500. The processor 1504 may communicate, either directly or indirectly, with substantially all of the components of the electronic device 1500. For example, a system bus or other communication mechanism 1514 may provide communication between the processor 1504, the power source 1506, the memory 1508, the sensor system 1510, and/or the input/output mechanism 1512.

The processor 1504 may be implemented as any electronic device capable of processing, receiving, or transmitting data or instructions. For example, the processor 1504 may be a microprocessor, a central processing unit (CPU), an application-specific integrated circuit (ASIC), a digital signal processor (DSP), a controller, or any combination of such devices. As described herein, the term "processor" is meant to encompass a single processor or processing unit, multiple processors, multiple processing units, or another suitably configured computing element or elements.

In some embodiments, the components of the electronic device 1500 may be controlled by multiple processors. For example, select components of the electronic device 1500 may be controlled by a first processor and other components of the electronic device 1500 may be controlled by a second processor, where the first and second processors may or may not be in communication with each other.

The power source 1506 may be implemented with any device capable of providing energy to the electronic device 1500. For example, the power source 1506 may include one or more disposable or rechargeable batteries. Additionally or alternatively, the power source 1506 may include a power connector or power cord that connects the electronic device 1500 to another power source, such as a wall outlet.

The memory 1508 may store electronic data that may be used by the electronic device 1500. For example, the memory 1508 may store electrical data or content such as, for example, audio and video files, documents and applications, device settings and user preferences, timing signals, control signals, data structures or databases, image data, maps, or focus settings. The memory 1508 may be configured as any type of memory. By way of example only, the memory 1508 may be implemented as random access memory, read-only memory, Flash memory, removable memory, other types of storage elements, or combinations of such devices.

The electronic device 1500 may also include one or more sensors defining the sensor system 1510. The sensors may be positioned substantially anywhere on the electronic device 1500. The sensor(s) may be configured to sense substantially any type of characteristic, such as but not limited to, touch, force, pressure, electromagnetic radiation (e.g., light), heat, movement, relative motion, biometric data, distance, and so on. For example, the sensor system 1510 may include a touch sensor, a force sensor, a heat sensor, a position sensor, a light or optical sensor, an accelerometer, a pressure sensor (e.g., a pressure transducer), a gyroscope, a magnetometer, a health monitoring sensor, an image sensor, a SPAD-based photon detector, and so on. Additionally, the one or more sensors may utilize any suitable sensing technology, including, but not limited to, capacitive, ultrasonic, resistive, optical, ultrasound, piezoelectric, and thermal sensing technology.

The I/O mechanism 1512 may transmit and/or receive data from a user or another electronic device. An I/O device may include a display, a touch sensing input surface such as a track pad, one or more buttons (e.g., a graphical user interface "home" button, or one of the buttons described herein), one or more cameras (including one or more 2D or 3D image sensors (e.g., one or more SPAD-based photon detectors)), one or more microphones or speakers, one or more ports such as a microphone port, and/or a keyboard. Additionally or alternatively, an I/O device or port may transmit electronic signals via a communications network, such as a wireless and/or wired network connection. Examples of wireless and wired network connections include, but are not limited to, cellular, Wi-Fi, Bluetooth, IR, and Ethernet connections. The I/O mechanism 1512 may also provide feedback (e.g., a haptic output) to a user.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A single-photon avalanche diode (SPAD)-based photon detector, comprising:
    a SPAD configured to generate an avalanche timing output signal in response to a photon arrival during each of a set of time intervals;
    a memory configured to store a set of counts corresponding to a set of photon time-of-arrival ranges;
    a time-to-digital converter (TDC) configured to,
        receive, during each time interval in the set of time intervals,
            a sequence of time references having a relationship to a time interval; and
            the avalanche timing output signal; and
        latch a time reference, in the sequence of time references, corresponding to a time of receipt of the avalanche timing output signal; and
    a circuit configured to advance a count, in the set of counts, corresponding to the latched time reference; wherein,
    the sequence of time references has a first phase for a first subset of time intervals in the set of time intervals;
    the sequence of time references has a second phase, shifted from the first phase, for a second subset of time intervals in the set of time intervals; and
    the first subset of time intervals is distinct from the second subset of time intervals.

2. The SPAD-based photon detector of claim 1, further comprising:
    at least a first layer subdivided into an array of pixels, each pixel comprising a respective SPAD in a set of SPADS; and
    at least a second layer stacked with the at least first layer and comprising a set of time-to-digital converters (TDCs) and the memory; wherein,
    each TDC in the set of TDCs is paired with a pixel in the array of pixels; and
    the set of SPADs includes the SPAD.

3. The SPAD-based photon detector of claim 2, wherein each TDC is included in or overlaps the pixel with which it is paired.

4. The SPAD-based photon detector of claim 3, wherein:
    the at least second layer comprises a set of SPAD quenching circuits;
    each SPAD quenching circuit in the set of SPAD quenching circuits is paired with a pixel in the array of pixels; and
    each SPAD quenching circuit is included in or overlaps the pixel with which it is paired.

5. The SPAD-based photon detector of claim 2, wherein:
    each TDC in a first subset of the set of TDCs is included in or overlaps the pixel with which it is paired; and
    each TDC in a second subset of the set of TDCs is offset from and does not overlap the pixel with which it is paired.

6. The SPAD-based photon detector of claim 5, wherein:
    the at least second layer comprises a set of SPAD quenching circuits;
    each SPAD quenching circuit in the set of SPAD quenching circuits is paired with a pixel in the array of pixels;
    each SPAD quenching circuit in a first subset of the set of SPAD quenching circuits is included in or overlaps the pixel with which it is paired; and
    each SPAD quenching circuit in a second subset of the set of SPAD quenching circuits is offset from and does not overlap the pixel with which it is paired.

7. The SPAD-based photon detector of claim 2, wherein:
    at least a portion of the memory is allocated for a subset of pixels in the array of pixels;
    a first subset of the TDCs paired with the pixels in the subset of pixels is disposed on a first lateral side of the at least portion of the memory; and
    a second subset of the TDCs paired with the pixels in the array of pixels is disposed on a second lateral side of the at least portion of the memory, the second lateral side opposite the first lateral side.

8. The SPAD-based photon detector of claim 1, further comprising:
    an array of SPADs including the SPAD; wherein,
    each SPAD in a subset of SPADs, in the array of SPADs, is configured to update the set of counts stored in the memory during different sets of time intervals.

9. The SPAD-based photon detector of claim 1, further comprising:

an electromagnetic radiation source; and a processor configured to cause the electromagnetic radiation source to emit a pulse of electromagnetic radiation for each time interval in the set of time intervals; wherein, the pulse of electromagnetic radiation has a known relationship to the sequence of time references; and the latched time reference indicates a time-of-flight of at least one photon in a respective pulse of electromagnetic radiation.

10. The SPAD-based photon detector of claim 1, further comprising:

a readout circuit configured to,
   read the set of counts from the memory as a first set of counts after the first subset of time intervals; and
   read the set of counts from the memory as a second set of counts after the second subset of time intervals; and a processor configured to build a moving average histogram of photon times-of-arrival detected by the SPAD, using at least the first set of counts and the second set of counts.

11. A method of building a moving average histogram of photon times of arrival, comprising:

for each time interval in a first subset of time intervals and a second subset of time intervals,
   latching a time reference corresponding to a time of receipt of an avalanche timing output signal of a single-photon avalanche diode (SPAD), the time reference being part of a sequence of time references for a time interval; and
   advancing a histogram count stored at a memory address corresponding to the latched time reference, the memory address being part of a set of memory addresses storing a set of histogram counts, and the memory address corresponding to a range of time references in the sequence of time references;

reading and clearing a first set of histogram counts from the set of memory addresses after the first subset of time intervals and before the second subset of time intervals;

phase-shifting the sequence of time references with respect to the set of memory addresses after the first subset of time intervals and for the second subset of time intervals;

reading and clearing a second set of histogram counts from the set of memory addresses after the second subset of time intervals; and building the moving average histogram using at least the first set of histogram counts and the second set of histogram counts.

12. The method of claim 11, wherein phase-shifting the sequence of time references with respect to the set of memory addresses comprises:

shifting the sequence of time references with respect to each time interval in the second subset of time intervals.

13. The method of claim 11, wherein phase-shifting the sequence of time references with respect to the set of memory addresses comprises delaying the avalanche timing output signal.

14. The method of claim 11, further comprising:

for each time interval in the first subset of time intervals and the second subset of time intervals,
   emitting a pulse of electromagnetic radiation having a known relationship to the sequence of time references; wherein, the time of receipt of the avalanche timing output signal indicates a time-of-flight of at least one photon in the pulse of electromagnetic radiation.

15. The method of claim 11, further comprising:

performing the latching and advancing for each time interval in a third subset of time intervals;

phase-shifting the sequence of time references with respect to the set of memory addresses after the second subset of time intervals and for the third subset of time intervals;

reading and clearing a third set of histogram counts from the set of memory addresses after the third subset of time intervals; and further building the moving average histogram using the third set of histogram counts.

16. An electronic device, comprising:

a single-photon avalanche diode (SPAD) configured to generate an avalanche timing output signal, in response to a photon arrival, during each of a set of time intervals;

a time-to-digital converter (TDC) configured to capture, during each time interval in the set of time intervals, a timing of the avalanche timing output signal;

a memory configured to store a set of counts in a set of memory locations, the set of memory locations corresponding to a programmable set of photon time-of-arrival ranges; and a circuit configured to increment a count in the set of counts, at a memory location, in the set of memory locations, corresponding to a captured timing of the avalanche timing output signal; wherein, a first number of timings of the avalanche timing output signal is mapped to a second number of counts in the set of counts, the second number being smaller than the first number; and after a first subset of time intervals in the set of time intervals, and for a second subset of time intervals in the set of time intervals, the set of photon time-of-arrival ranges is phase-shifted with respect to the set of memory locations.

17. The electronic device of claim 16, further comprising:

a processor configured to,
   receive a first set of counts read from the set of memory locations after the first subset of time intervals; and
   receive a second set of counts read from the set of memory locations after the second subset of time intervals; and
   build, using at least the first set of counts and the second set of counts, a moving average histogram of photon times of arrival detected by the SPAD, the moving average histogram having a number of time-of-arrival bins greater than the second number of counts.

18. The electronic device of claim 16, wherein the TDC is a non-linear TDC.

19. The electronic device of claim 18, wherein:

a first subset of timings of the avalanche timing output signal is mapped to a corresponding first subset of the set of counts in a one-to-one mapping; and a second subset of timings of the avalanche timing output signal is mapped to a corresponding second subset of the set of counts in a many-to-one mapping.

20. The electronic device of claim 16, wherein:

the set of counts is a first set of counts, and the set of memory locations is a first set of memory locations;

the memory is configured to store a second set of counts in a second set of memory locations; and a third number of timings of the avalanche timing output signal is mapped to a fourth number of counts in the second set of counts, the fourth number being equal to the third number.

* * * * *